(12) United States Patent
Miyamoto et al.

(10) Patent No.: US 11,655,536 B2
(45) Date of Patent: May 23, 2023

(54) FILM FORMING MASK AND METHOD OF MANUFACTURING DISPLAY DEVICE USING SAME

(71) Applicant: SHARP KABUSHIKI KAISHA, Sakai (JP)

(72) Inventors: Yoshinobu Miyamoto, Sakai (JP); Tohru Sonoda, Sakai (JP)

(73) Assignee: SHARP KABUSHIKI KAISHA, Osaka (JP)

(*) Notice: Subject to any disclaimer, the term of this patent is extended or adjusted under 35 U.S.C. 154(b) by 234 days.

(21) Appl. No.: 16/981,982

(22) PCT Filed: Mar. 20, 2018

(86) PCT No.: PCT/JP2018/011178
§ 371 (c)(1),
(2) Date: Sep. 17, 2020

(87) PCT Pub. No.: WO2019/180846
PCT Pub. Date: Sep. 26, 2019

(65) Prior Publication Data
US 2021/0108310 A1  Apr. 15, 2021

(51) Int. Cl.
*C23C 16/04* (2006.01)
*H01L 51/52* (2006.01)
(Continued)

(52) U.S. Cl.
CPC ............ *C23C 16/042* (2013.01); *C23C 16/22* (2013.01); *H10K 50/844* (2023.02); *H10K 71/00* (2023.02)

(58) Field of Classification Search
CPC ............ C23C 8/04; C23C 10/04; C23C 14/04; C23C 14/042; C23C 14/048; C23C 16/04;
(Continued)

(56) References Cited

U.S. PATENT DOCUMENTS 6,469,439 B2 * 10/2002 Himeshima ......... H01L 27/3283
313/506
6,749,690 B2 * 6/2004 Clark .................... H01L 21/682
118/721

(Continued)

FOREIGN PATENT DOCUMENTS

CN     206477019 U  *  9/2017  ............. C23C 14/04
JP     2000-173769 A  *  6/2000  ............. G09F 13/22
(Continued)

OTHER PUBLICATIONS

Machine translation, Iwata, Japanese Pat. Pub. No. JP2006-059599A, translation date: Jul. 1, 2022, Espacenet, all pages. (Year: 2022).*

(Continued)

*Primary Examiner* — Victoria K. Hall
(74) *Attorney, Agent, or Firm* — ScienBiziP, P.C.

(57) ABSTRACT

A film forming mask includes a plurality of first openings that are formed on the film-forming mask to form a thin film pattern on a substrate. A second opening includes a plurality of second openings that corresponds and is aligned along a side of at least one of the plurality of first openings. An opening area of the second opening is smaller than an opening area of each of the plurality of first openings.

7 Claims, 14 Drawing Sheets

(51) Int. Cl.
*H01L 51/56* (2006.01)
*C23C 16/22* (2006.01)

(58) Field of Classification Search
CPC ....... C23C 16/042; C23C 18/06; C23C 18/16; C30B 25/04
USPC .................................................. 118/504, 505
See application file for complete search history.

(56) References Cited

U.S. PATENT DOCUMENTS

| | | | | |
|---|---|---|---|---|
| 6,858,086 B2* | 2/2005 | Kang | ................... | C23C 14/042 |
| | | | | 204/298.11 |
| 7,285,906 B2* | 10/2007 | Ohshita | ............... | H01L 27/3223 |
| | | | | 313/506 |
| 7,821,199 B2* | 10/2010 | Arai | .................... | H01L 27/3223 |
| | | | | 313/506 |
| 7,837,528 B2* | 11/2010 | Shigemura | ............. | C23C 14/12 |
| | | | | 427/66 |
| 8,656,859 B2* | 2/2014 | Hong | ................. | H01L 51/0011 |
| | | | | 118/504 |
| 8,757,088 B2* | 6/2014 | Lee | ......................... | C23C 14/04 |
| | | | | 118/504 |
| 8,852,346 B2* | 10/2014 | Lee | ....................... | C23C 14/042 |
| | | | | 156/345.3 |
| 8,881,676 B2* | 11/2014 | Hong | ................... | C23C 14/044 |
| | | | | 118/504 |
| 8,927,180 B2* | 1/2015 | Prushinskiy | .............. | C23F 1/02 |
| | | | | 430/5 |
| 9,192,959 B2* | 11/2015 | Hong | ....................... | C23C 14/12 |
| 9,346,078 B2* | 5/2016 | Oh | ...................... | H01L 51/0011 |
| 9,362,501 B2* | 6/2016 | Hsu | ........................ | C23C 14/12 |
| 9,441,288 B2* | 9/2016 | Sung | .................. | C23C 18/1605 |
| 9,570,715 B2* | 2/2017 | Kang | ....................... | H01L 51/56 |
| 9,583,708 B2* | 2/2017 | Ko | ........................ | C23C 14/042 |
| 9,695,500 B2* | 7/2017 | Ko | ......................... | H01L 51/56 |
| 10,147,880 B2* | 12/2018 | Sung | ................... | C23C 14/042 |
| 10,344,376 B2* | 7/2019 | Hong | .................. | C23C 14/042 |
| 2001/0004469 A1* | 6/2001 | Himeshima | ......... | H01L 51/0011 |
| | | | | 427/64 |
| 2001/0054864 A1* | 12/2001 | Hens | ..................... | H01J 29/073 |
| | | | | 313/407 |
| 2003/0101932 A1* | 6/2003 | Kang | ..................... | H01L 51/56 |
| | | | | 118/504 |
| 2004/0104197 A1* | 6/2004 | Shigemura | ............. | C23C 14/12 |
| | | | | 216/20 |
| 2004/0115342 A1* | 6/2004 | Shigemura | ............... | C23F 1/02 |
| | | | | 101/112 |
| 2004/0183435 A1* | 9/2004 | Ohshita | .............. | H01L 27/3223 |
| | | | | 313/506 |
| 2008/0018236 A1* | 1/2008 | Arai | ...................... | C23C 14/042 |
| | | | | 445/24 |
| 2009/0188890 A1* | 7/2009 | Khan | ................... | H05K 3/3452 |
| | | | | 216/17 |
| 2011/0031486 A1* | 2/2011 | Shigemura | .......... | H01L 27/3223 |
| | | | | 257/E51.019 |
| 2011/0185561 A1* | 8/2011 | Landgraf | ................. | G03F 7/12 |
| | | | | 29/446 |
| 2011/0265714 A1* | 11/2011 | Lee | ......................... | C23C 14/04 |
| | | | | 118/504 |
| 2012/0266813 A1* | 10/2012 | Hong | ..................... | C23C 14/044 |
| | | | | 118/504 |
| 2012/0279444 A1* | 11/2012 | Hong | ................... | C23C 14/042 |
| | | | | 118/504 |
| 2013/0137334 A1* | 5/2013 | Ishikawa | ............. | C23C 14/5886 |
| | | | | 118/504 |
| 2014/0242737 A1* | 8/2014 | Chung | ................ | H01L 51/5221 |
| | | | | 118/504 |
| 2014/0306600 A1* | 10/2014 | Kim | ..................... | H01L 51/0011 |
| | | | | 445/24 |
| 2015/0013600 A1* | 1/2015 | Hsu | ..................... | H01L 51/0011 |
| | | | | 118/504 |
| 2015/0013601 A1* | 1/2015 | Lee | ....................... | B05C 21/005 |
| | | | | 118/504 |
| 2015/0047560 A1* | 2/2015 | Kang | .................. | H01L 27/3223 |
| | | | | 118/504 |
| 2015/0102329 A1* | 4/2015 | Lee | ..................... | H01L 51/0011 |
| | | | | 438/34 |
| 2016/0043319 A1* | 2/2016 | White | ................. | H01L 51/0012 |
| | | | | 359/230 |
| 2016/0167083 A1* | 6/2016 | Kim | ...................... | C23C 14/042 |
| | | | | 118/504 |
| 2016/0312354 A1* | 10/2016 | Ko | ........................ | C23C 14/042 |
| 2016/0319422 A1* | 11/2016 | Kurita | ................. | H01L 51/5253 |
| 2018/0287064 A1* | 10/2018 | Matsueda | ............... | C23C 16/56 |
| 2019/0136365 A1* | 5/2019 | Kawasaki | .............. | H05B 33/10 |
| 2019/0203338 A1* | 7/2019 | Kawasaki | .............. | H05B 33/10 |
| 2019/0378984 A1* | 12/2019 | Nakamura | .......... | H01L 51/5012 |

FOREIGN PATENT DOCUMENTS

| | | | | | |
|---|---|---|---|---|---|
| JP | 2001-118780 | A | * | 4/2001 | ............... G03F 1/20 |
| JP | 2002-60927 | A | * | 2/2002 | ............. C23C 14/04 |
| JP | 2006-59599 | A | * | 3/2006 | ............. C23C 16/04 |
| JP | 2006-059599 | A | | 3/2006 | |
| JP | 2009041061 | A | * | 2/2009 | ............. C23C 14/24 |
| JP | 2012-229484 | A | | 11/2012 | |
| JP | 2016-3384 | A | * | 1/2016 | ............. C23C 16/04 |
| JP | 2016-003384 | A | | 1/2016 | |

OTHER PUBLICATIONS

Machine translation, Kamiya, Japanese Pat. Pub. No. JP2016-003384A, translation date: Jul. 1, 2022, Espacenet, all pages. (Year: 2022).*

Machine translation, Fujimori, Japanese Pat. Pub. No. JP2000-173769A, translation date: Jul. 1, 2022, Espacenet, all pages. (Year: 2022).*

Machine translation, Nakagawara, Japanese Pat. Pub. No. JP2002-060927A, translation date: Jul. 1, 2022, Espacenet, all pages. (Year: 2022).*

Machine translation, Suzuki, Japanese Pat. Pub. No. JP2001-118780A, translation date: Jul. 1, 2022, Espacenet, all pages. (Year: 2022).*

International Searching Authority, Written Opinion of International Searching Authority, International Application No. PCT/JP2018/011178, dated Jun. 26, 2018, all pages. (Year: 2018).*

International Searching Authority, International Search Report, International Application No. PCT/JP2018/011178, dated Jun. 26, 2018, all pages. (Year: 2018).*

T. Yamazaki et al., Slit Structure as a Countermeasure for the Thermal Deformation of a Metal Mask, Dec. 2001, Jpn. J. Appl. Phys., vol. 40, pp. 7170-7173. (Year: 2011).*

Machine translation, Mori, Japanese Pat. Pub. No. JP-2009041061-A, translation date: Dec. 6, 2022, Clarivate Analytics, all pages. (Year: 2022).*

Machine translation, Zhang, Chinese Pat. Pub. No. CN206477019U, translation date: Feb. 15, 2023, Clarivate Analytics, all pages. (Year: 2023).*

* cited by examiner

FILM FORMING MASK AND METHOD OF MANUFACTURING DISPLAY DEVICE USING SAME

TECHNICAL FIELD

The present disclosure relates to a film forming mask, and a method for manufacturing a display device using the same.

BACKGROUND ART

In recent years, organic EL display devices, which use Electro Luminescence (EL) elements and are of the self-luminous type, have attracted attention as a display device that can replace the liquid crystal display device. In organic EL display devices, a sealing film covering the organic EL element is generally provided to suppress deterioration of the organic EL element due to ingress of moisture, oxygen, or the like. As a sealing structure using this sealing film, a structure has been proposed in which the sealing film is formed by a layered film including an organic layer and an inorganic layer. The inorganic layer constituting the sealing film covers the organic layer, and, for example, is formed by a Chemical Vapor Deposition (CVD) method by using a film forming mask (for example, see PTL 1).

CITATION LIST

Patent Literature

PTL 1: JP 2006-59599 A

SUMMARY

Technical Problem

Incidentally, during film formation of the inorganic layer by a vapor deposition method such as the CVD, heat is always applied to the film forming mask, and thus deformation due to thermal expansion occurs in the film forming mask. The film forming mask is prepared by using a material having a low coefficient of thermal expansion such as an Invar material in order to suppress such deformation during film formation, but even in a case that a material having a low coefficient of thermal expansion is used, deformation due to thermal expansion is not avoided in the film forming mask.

In a case that the film forming mask deforms due to thermal expansion, deformation occurs in the inorganic layer to be formed from a predetermined pattern, which makes it difficult to form the inorganic layer with high accuracy. As a result, in the sealing film, in a case that the organic layer is exposed without the inorganic layer covering the organic layer, moisture or oxygen is allowed to enter the display region from the exposed portion of the organic layer, and the organic EL element is deteriorated.

In a case of manufacturing the organic EL display device by multiple printing, in a case that the inorganic layer is over the cutting surface of the mother panel, cracks are likely to be generated in the inorganic layer during partitioning of the mother panel. In a case that the cracks generated in the inorganic layer progress to the display region, sealing performance by the sealing film decreases, allowing moisture and oxygen to enter the display region through the cracks even in a case that the organic layer is not exposed, and the organic EL element is deteriorated.

In light of the foregoing, an object of the technique of the present disclosure is to stabilize a patterning shape of a thin film to be formed by using a film forming mask.

Solution to Problem

In order to achieve the object described above, a film forming mask according to a technique of the present disclosure is a film forming mask including: a plurality of first openings formed on the film forming mask for film-forming a thin film pattern on a substrate; and a second opening formed around each of the plurality of first openings, wherein an opening area of the second opening is smaller than an opening area of each of the plurality of first openings.

Advantageous Effects of Disclosure

According to the film forming mask according to the technique of the present disclosure, since a second opening having an opening area smaller than that of the first openings is formed around the first openings for film formation, the area of the non-opening portion of the film forming mask is reduced, and the amount of thermal expansion of the non-opening portion is reduced. Furthermore, because the thermal expansion of the film forming mask acts in the direction of narrowing the second opening, the amount of thermal expansion acting in the direction of narrowing the first openings is reduced, and the effect of thermal expansion on the first openings can be reduced. As a result, deformation of the first openings in a case that thermal expansion occurs in the film forming mask can be suppressed, and the patterning shape of the thin film formed by using the film forming mask can be stabilized.

DESCRIPTION OF EMBODIMENTS

Exemplary embodiments will be described below in detail with reference to the drawings.

This embodiment describes a film forming mask according to the technique of the present disclosure, a method for manufacturing an organic EL display device using the film forming mask, and a configuration of the organic EL display device manufactured by the method for manufacturing.

Configuration of Organic EL Display Device

Figure 1:
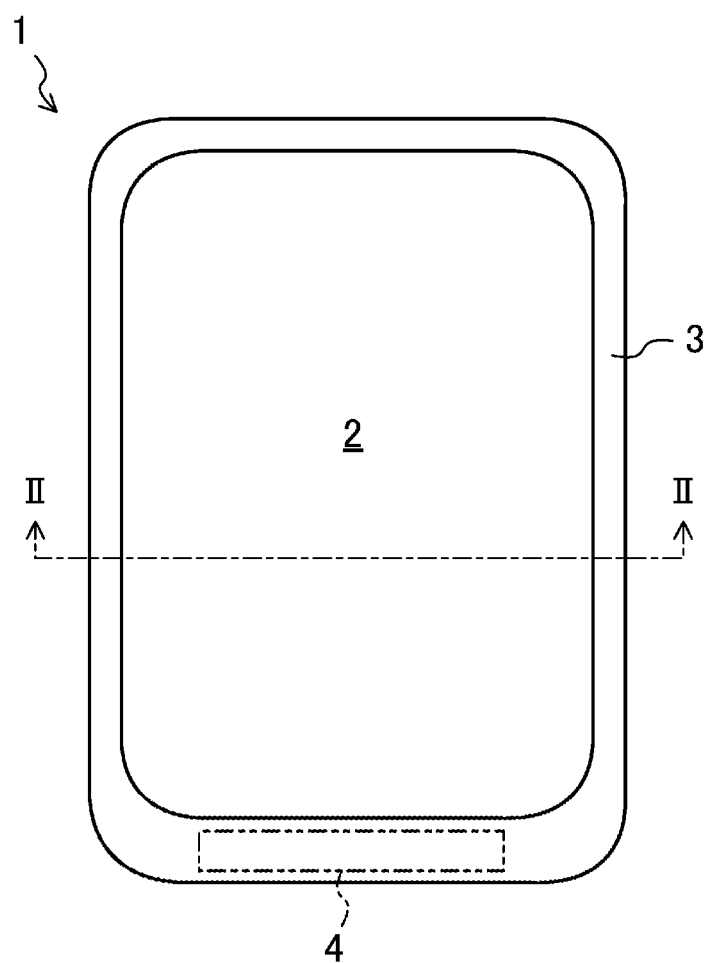
FIG. 1 is a plan view illustrating a schematic configuration of an organic EL display device.
Figure 2:
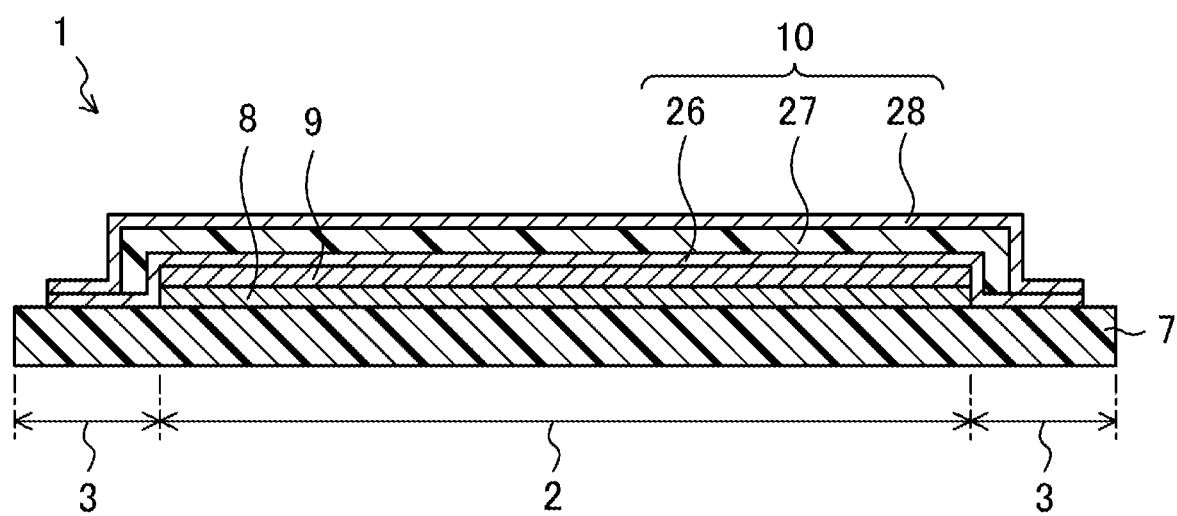
FIG. 2 is a cross-sectional view taken along a line II-II of the organic EL display device in FIG. 1.
Figure 3:
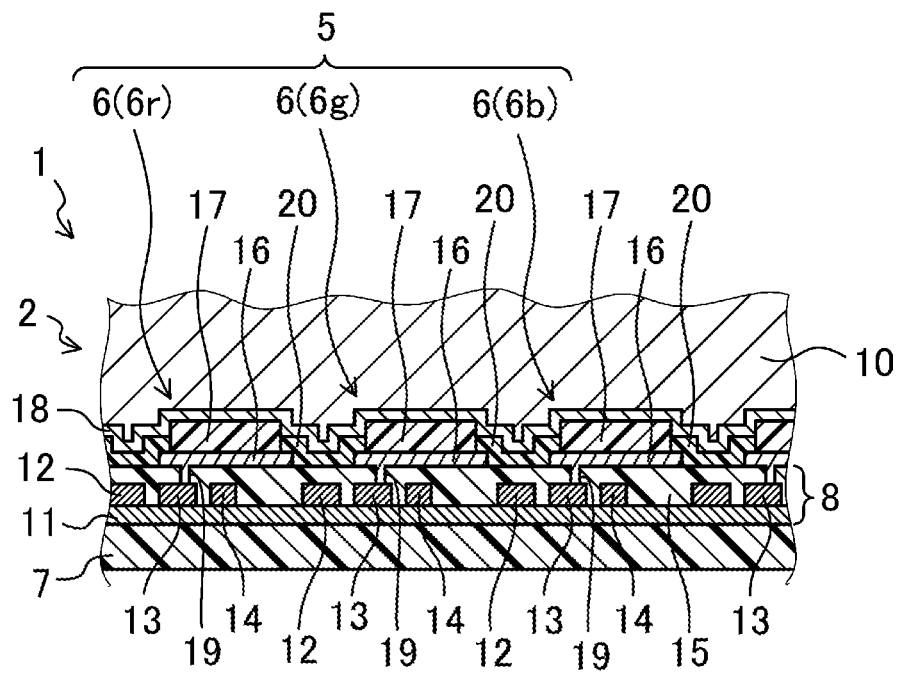
FIG. 3 is a cross-sectional view illustrating an internal configuration of the organic EL display device.
Figure 4:
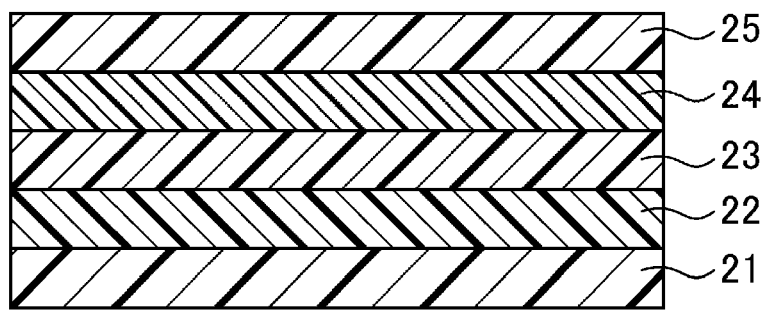
FIG. 4 is a cross-sectional view illustrating a structure of an organic EL layer included in the organic EL display device.

An organic EL display device 1 will be described with reference to FIG. 1 to FIG. 4. FIG. 1 is a plan view illustrating a schematic configuration of the organic EL display device 1. FIG. 2 is a cross-sectional view taken along a line II-II of the organic EL display device 1 in FIG. 1. FIG. 3 is a cross-sectional view illustrating an internal configuration of the organic EL display device 1. FIG. 4 is a cross-sectional view illustrating a structure of an organic EL layer 17 included in the organic EL display device 1.

As illustrated in FIG. 1, the organic EL display device 1 has a substantially rectangular outer shape having four corners being rounded in a curved line shape in a plan view. The organic EL display device 1 is provided with a display region 2 for displaying an image provided in a substantially rectangular shape having four corners being in a curved line shape so as to correspond to the outer shape of the display device 1, and a frame region 3 provided in a substantially rectangular frame shape around the display region 2. A terminal portion 4 for connecting to external circuits is provided in the frame region 3. An end portion of a wiring line substrate such as a Flexible Printed Circuit (FPC) not illustrated is connected to the terminal portion 4.

The organic EL display device 1 employs an active matrix driving method. A plurality of pixels 5 (see FIG. 3) are arranged in a matrix shape in the display region 2. Each of the pixels 5 includes, for example, subpixels 6 of three colors including a subpixel 6r for displaying a red color, a subpixel 6g for displaying a green color, and a subpixel 6b for displaying a blue color. These subpixels 6 of three colors are, for example, arranged in a juxtaposed manner and are adjacent in a stripe shape.

As illustrated in FIG. 2, the organic EL display device 1 includes a resin substrate layer 7 as a base substrate, a Thin Film Transistor (TFT) layer 8 provided on the resin substrate layer 7, an organic EL element 9 serving as a light-emitting element provided on the TFT layer 8, and a sealing film 10 covering the organic EL element 9.

The resin substrate layer 7 is formed in a substantially rectangular shape so as to form the outer shape of the organic EL display device 1. The resin substrate layer 7 is formed, for example, of a polyimide resin or the like and is flexible.

As illustrated in FIG. 3, the TFT layer 8 includes a base coat film 11 provided on the resin substrate layer 7, a plurality of first TFTs 12, a plurality of second TFTs 13, and a plurality of capacitors 14 provided on the base coat film 11, a plurality of wiring lines not illustrated, and a flattening film 15 provided so as to cover these first TFTs 12, the second TFTs 13, the plurality of capacitors 14, and each wiring line.

The base coat film 11 is made up of a single layer film or a layered film of an inorganic insulating film of, for example, silicon nitride, silicon oxide, silicon oxynitride, or the like. Each of the first TFTs 12, the second TFTs 13, and the capacitors 14 are provided for each subpixel 6.

As the wiring lines, a plurality of gate wiring lines extending parallel to each other, a plurality of source wiring lines extending parallel to each other in a direction intersecting with each of the gate wiring lines, and a plurality of power source wiring lines extending along each of the source wiring lines are provided. The gate wiring lines, the source wiring lines, and the power source wiring lines are insulated from each other, and are formed in a lattice pattern as a whole to partition each subpixel 6.

The first TFTs 12 are connected to the corresponding gate wiring lines and the source wiring lines. The second TFTs 13 are connected to the corresponding gate wiring lines and the power source wiring lines. Both of these first TFTs 12 and second TFTs 13 employ a top gate type structure, for example. The capacitors 14 are connected to the corresponding first TFTs 12 and the power source wiring lines.

The flattening film 15 covers all faces of the second TFTs 13 other than a portion of drain electrodes of the second TFTs 13 so as to flatten the surface of the TFT layer 8 and such that surface shapes of the first TFTs 12 and second TFTs 13 are not reflected. The flattening film 15 is formed of, for example, a colorless and transparent organic resin material, such as a polyimide resin.

The organic EL element 9 employs a top-emitting type structure. The organic EL element 9 includes a plurality of first electrodes 16 provided on the surface of the flattening film 15, organic EL layers 17 provided on each of the first electrodes 16, and a second electrode 18 that overlaps the first electrodes 16 with the organic EL layers 17 interposed therebetween.

The first electrodes 16 are disposed in a matrix shape corresponding to each of the subpixels 6, and are connected to the drain electrodes of the second TFTs 13 in the corresponding subpixels 6 via contact holes 19 formed in the flattening film 15. It is preferable that the first electrodes 16 include a function to inject holes into the organic EL layers 17, and are formed of a material having a large work function to improve the hole injection efficiency into the organic EL layers 17.

Examples of the material of the first electrodes 16 include, for example, metal materials such as silver (Ag), aluminum (Al), titanium (Ti), an alloy of magnesium (Mg) and silver (Ag), an alloy of lithium (Li) and aluminum (Al), and electrically conductive oxides such as tin oxide (SnO), zinc oxide (ZnO), indium tin oxide (ITO), and indium zinc oxide (IZO). The first electrodes 16 are constituted by a single layer film or a layered film of conductive films made of such metal materials or electrically conductive oxides.

Each of the first electrodes 16 of adjacent subpixels 6 are partitioned by edge covers 20. The edge covers 20 are formed in a lattice pattern and cover the peripheral portions of each of the first electrodes 16. Examples of the material of the edge cover 20 include inorganic compounds such as silicon oxide, silicon nitride, silicon oxynitride, and the like, and organic resin materials such as polyimide resin, acrylic resin, polysiloxane resin, novolak resin, and the like, for example.

The organic EL layers 17 are provided for each of the subpixels 6. Each of the organic EL layers 17 has a structure in which a hole injection layer 21, a hole transport layer 22, a light-emitting layer 23, an electron transport layer 24, and an electron injection layer 25 illustrated in FIG. 4 are layered on the first electrode 16 in this order. A known material that realizes the following functions is used as the material of the hole injection layer 21, the hole transport layer 22, the light-emitting layer 23, the electron transport layer 24, and the electron injection layer 25.

The hole injection layer 21 is also referred to as an anode buffer layer, and functions to reduce the energy level difference between the first electrode 16 and the organic EL layer 17, to improve the efficiency of hole injection into the organic EL layer 17 from the first electrode 16. The hole transport layer 22 functions to improve the efficiency of hole transport from the first electrode 16 to the organic EL layer 17.

The light-emitting layer 23 functions to recouple the holes injected from the first electrode 16 and the electrons injected from the second electrode 18 and emit light in a case that a voltage is applied by the first electrode 16 and the second electrode 18. The light-emitting layer 23 is formed from a different material in accordance with the luminescent colors (for example, red color, green color, or blue color) of the organic EL element 9.

The electron transport layer 24 functions to facilitate migration of electrons to the light-emitting layer 23 efficiently. The electron injection layer 25 is also referred to as a cathode buffer layer, and functions to reduce the energy level difference between the second electrode 18 and the organic EL layer 17, to improve the electron injection efficiency into the organic EL layer 17 from the second electrode 18.

The second electrode 18 is provided in common with the plurality of subpixels 6 and covers the organic EL layers 17. It is preferable that the second electrode 18 has a function of injecting electrons into the organic EL layer 17, and is formed from a material having a small work function in order to improve the efficiency of electron injection into the organic EL layer 17.

Examples of the material of the second electrode 18 include, for example, metal materials such as silver (Ag), aluminum (Al), titanium (Ti), an alloy of magnesium (Mg) and silver (Ag), an alloy of lithium (Li) and aluminum (Al), and electrically conductive oxides such as tin oxide (SnO), zinc oxide (ZnO), indium tin oxide (ITO), and indium zinc oxide (IZO). The second electrode 18 is constituted by a single layer film or a layered film of conductive films made of such metal materials or electrically conductive oxides.

The sealing film 10 functions to protect the organic EL element 9 from moisture, oxygen, or the like. As illustrated in FIG. 2, the sealing film 10 includes a first inorganic layer 26 covering the second electrode 18, an organic layer 27 provided on the first inorganic layer 26, and a second inorganic layer 28 covering the organic layer 27.

The first inorganic layer 26 and the second inorganic layer 28 are formed from, for example, an inorganic material such as silicon oxide ($SiO_2$), aluminum oxide ($Al_2O_3$), and silicon carbonitride ($Si_3N_4$). The first inorganic layer 26 and the second inorganic layer 28 have a substantially rectangular outer shape similar to that of the resin substrate layer 7, and are vapor deposition layers (thin film patterns) common to the plurality of pixels 5, for example, formed by a CVD, by using a film forming mask 50 described below that can be patterned in a display panel unit.

The organic layer 27 is formed of an organic resin material such as an acrylate, epoxy resin, silicone, polyurea, parylene, polyimide, polyamide, or the like, for example.

The peripheral portions of the organic layer 27 are positioned closer to the display region 2 side than the peripheral portions of the first inorganic layer 26 and the second inorganic layer 28. The peripheral portions of the first inorganic layer 26 and the second inorganic layer 28 are joined to each other. The organic layer 27 is encased by the first inorganic layer 26 and the second inorganic layer 28, and is encapsulated between the first inorganic layer 26 and the second inorganic layer 28.

In the organic EL display device 1 having the configuration described above, in each of the subpixels 6, the first TFT 12 is in the on state in a case that a gate signal is input to the first TFT 12 via the gate wiring line, a predetermined voltage corresponding to the source signal is written to the gate electrode of the second TFT 13 and the capacitor 14 via the source wiring line, and the current corresponding to the gate voltage of the second TFT 13 is supplied from the power source wiring line to the organic EL element 9, thereby causing the light-emitting layer 23 of the organic EL layer 17 to emit light and display an image. Note that, in the organic EL display device 1, since even in a case that the first TFT 12 is in the off state, the gate voltage of the second TFT 13 is held by the capacitor 14, the organic EL layer 17 (light-emitting layer 23) is kept emitting light for each of the subpixels 6, until a gate signal of the next frame is inputted.

Such an organic EL display device 1 is manufactured by, for a mother substrate including a plurality of substrate regions to be as the resin substrate layers 7, partitioning the mother substrate for each substrate region after the TFT layer 8, the organic EL element 9, and the sealing film 10 are respectively fabricated in each substrate region, and forming the display panels constituting the display device 1 by multiple printing.

In a case that the organic EL display device 1 is manufactured by multiple printing, in a case that the first inorganic layer 26 and the second inorganic layer 28 that constitute the sealing film 10 are over the cutting surface of the mother substrate, cracks will occur in these inorganic layers 26 and 28 during partitioning of the mother substrate, allowing moisture and oxygen to enter the display region 2 through the cracks, which may lead to deterioration of the organic EL element 9. In the sealing film 10, in a case that the organic layer 27 is exposed without the first inorganic layer 26 and the second inorganic layer 28 completely covering the organic layer 27, the organic EL element 9 also deteriorates.

For those reasons, in the organic EL display device 1, the first inorganic layer 26 and the second inorganic layer 28 need to be configured such that each peripheral edge of the first inorganic layer 26 and the second inorganic layer 28 are positioned between the peripheral edge of the organic layer 27 and the peripheral edge of the resin substrate layer 7 and completely cover the organic layer 27. Here, because the width between the peripheral edge of the organic layer 27 and the peripheral edge of the resin substrate layer 7 is narrow because of the demand for frame narrowing, in the manufacturing of the organic EL display device 1, the first inorganic layer 26 and the second inorganic layer 28 are required to be formed with a stable patterning shape with high accuracy.

As one of the factors that cause the patterning shape of the first inorganic layer 26 and the second inorganic layer 28 to become unstable, the deformation caused by thermal expansion during film formation of the film forming mask used to form the first inorganic layer 26 and the second inorganic layer 28 has an effect. Therefore, in the present embodiment, in the manufacturing of the organic EL display device 1, a mask that has been devised to reduce the effect of deformation caused by thermal expansion on the patterning shape of the thin film to be formed is used as a film forming mask used to form the first inorganic layer 26 and the second inorganic layer 28.

The following describes an example of a case in which four display panels are taken from a mother substrate as a method for manufacturing the film forming mask 50 and the organic EL display device 1 using the film forming mask 50.

Configuration of Film Forming Mask

Figure 5:
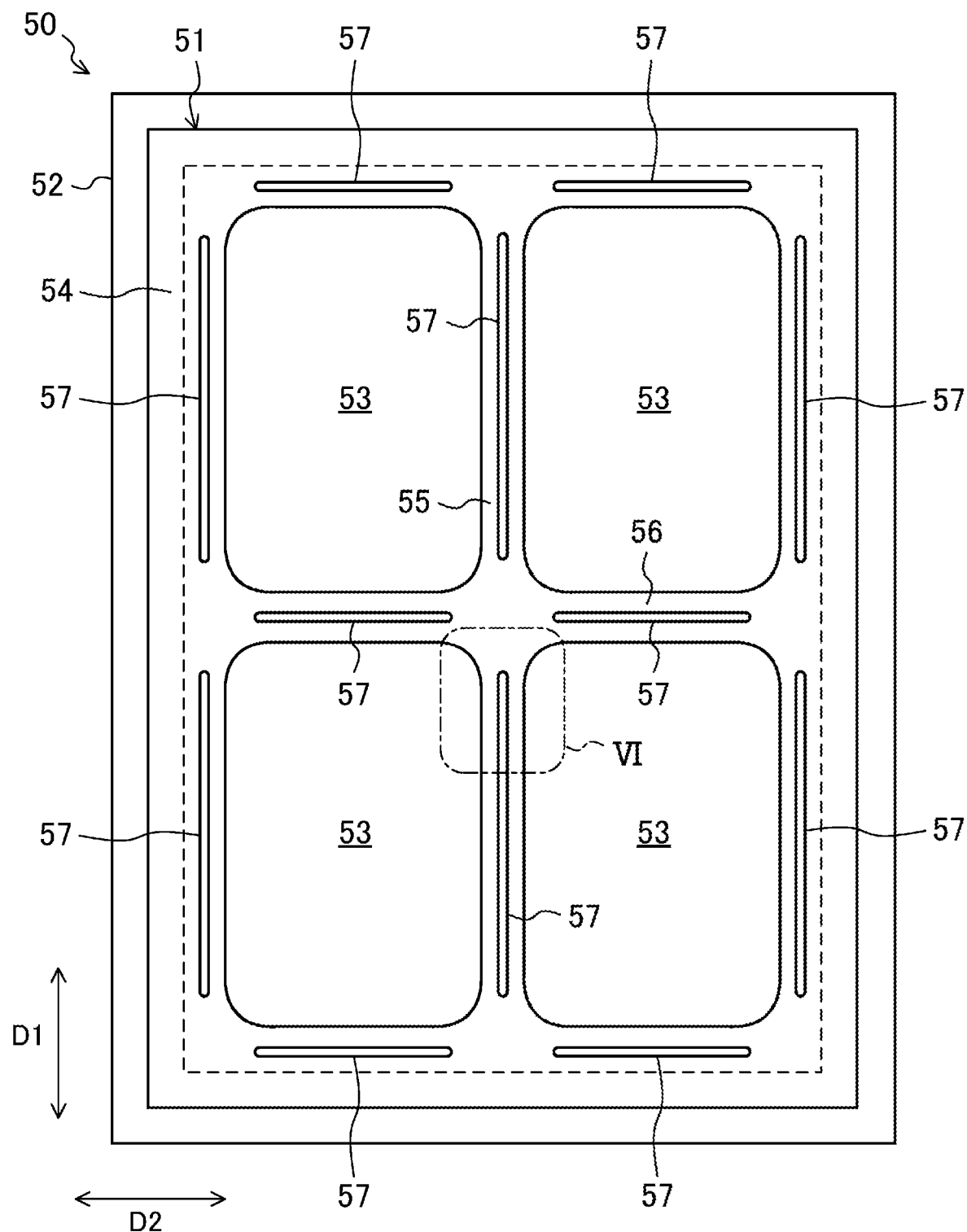
FIG. 5 is a plan view illustrating a schematic configuration of a film forming mask according to the present embodiment.
Figure 6:
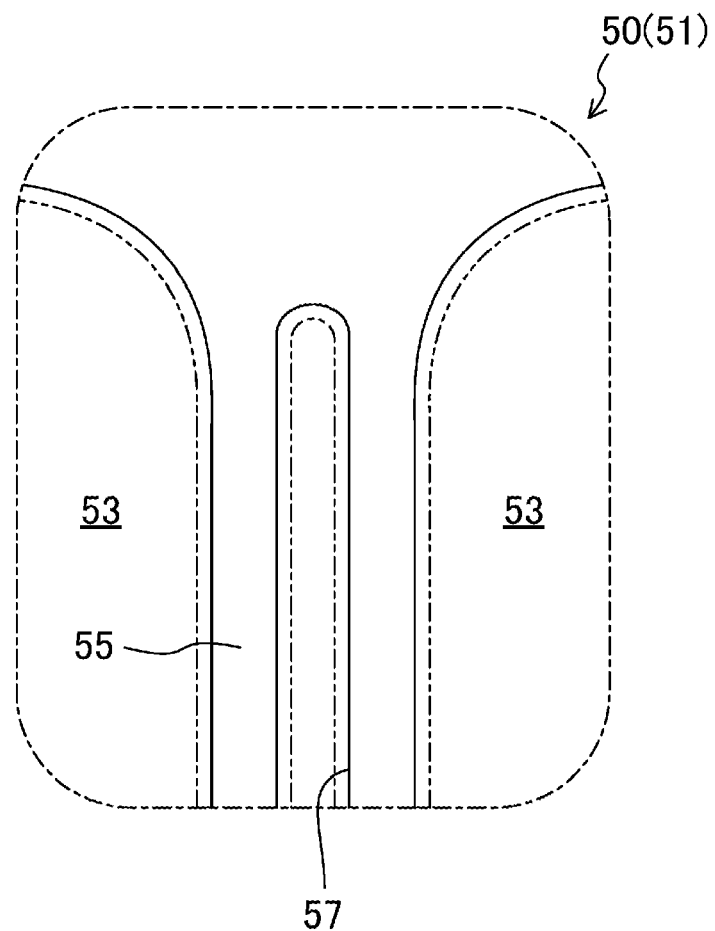
FIG. 6 is an enlarged view of a portion of the film forming mask surrounded by VI illustrated in FIG. 5.

The film forming mask 50 will be described with reference to FIG. 5 and FIG. 6. FIG. 5 is a plan view illustrating a schematic configuration of the film forming mask 50. FIG. 6 is an enlarged view of a portion of the film forming mask 50 surrounded by VI illustrated in FIG. 5. Note that the long dashed double-short dashed line in FIG. 6 indicates the periphery of openings 53 in a state where deformation due to thermal expansion has occurred in the film forming mask 50.

The film forming mask 50 is a Common Metal Mask (CMM), which is also referred to as an open mask, and is used to form the first inorganic layer 26 or the second inorganic layer 28 that constitute the sealing film 10 in manufacture of the organic EL display device 1. As illustrated in FIG. 5, the film forming mask 50 includes a mask sheet 51 having a rectangular outer shape, and a support frame 52 having a rectangular frame shape to which the mask sheet 51 is tensioned.

The mask sheet 51 and the support frame 52 are formed from a metal material having a low coefficient of thermal expansion so as to suppress warping or distortion caused by thermal expansion or the like during film formation processing. Examples of such metal material include alloys including nickel (Ni), such as Invar materials. The mask sheet 51 is a masking member having a sheet shape.

Four openings 53 are formed in the mask sheet 51 as first openings for forming a thin film pattern on the mother substrate. The mask sheet 51 is formed integrally with an outer frame portion 54 having a rectangular frame shape, a first cross-piece portion 55 extending in a first direction D1 inside the outer frame portion 54, and a second cross-piece portion 56 extending in a second direction D2 intersecting with the first cross-piece portion 55 inside the outer frame portion 54 (orthogonal in the example illustrated in FIG. 5).

The first cross-piece portion 55 and the second cross-piece portion 56 constitute a cross portion that bisects the inside of the outer frame portion 54 in both the first direction D1 and the second direction D2, and share an intersecting portion corresponding to the mutually intersecting portions. The widths of the first cross-piece portion 55 and the second cross-piece portion 56 are configured to, for example, 2.5 mm or greater and 4.0 mm or less. The second cross-piece portion 56 is a portion corresponding to the terminal portion 4 of the display panel constituting the organic EL display device 1. Therefore, the width of the second cross-piece portion 56 is designed to be greater than the width of the first cross-piece portion 55.

The four openings 53 are defined and formed by the outer frame portion 54, the first cross-piece portion 55, and the second cross-piece portion 56, and are arranged in a matrix shape of two rows and two columns. These openings 53 are provided corresponding to each substrate region constituting a display panel unit of the mother substrate, and are openings for forming the first inorganic layer 26 or the second inorganic layer 28. Each of the openings 53 has a substantially rectangular shape with rounded corner portions at the four corners so as to correspond to the outer shape of the organic EL display device 1 to be manufactured.

The size of these openings 53 is configured to be a size depending on the application of the film forming mask 50, that is, the forming region of the thin film pattern to be formed. In other words, in the film forming mask 50 of the present embodiment, the size of the openings 53 in the mask sheet 51 is configured to be a size corresponding to the forming regions of the first inorganic layer 26 and the second inorganic layer 28 that constitute the sealing film 10. The openings 53 are configured to be a size, for example, corresponding to a diagonal of 6 inches.

In addition to the four openings 53, slits 57 are formed in the mask sheet 51 as second openings including small gaps around the openings 53. A plurality of slits 57 are formed so as to correspond to each side of the openings 53.

Specifically, the slits 57 are each formed at eight portions corresponding to two sides facing outward of the mask sheet 51 in the four openings 53 in the outer frame portion 54, two portions between the two openings 53 adjacent in the second direction D2 in the first cross-piece portion 55, and two portions between the two openings 53 adjacent in the first direction D1 in the second cross-piece portion 56. The slits 57 corresponding to the sides facing each other of the two openings 53 adjacent in the first direction D1 and the second direction D2 are each provided in common.

Each of the slits 57 extends in a straight line along the periphery of the openings 53, and only one slit is formed in the direction along each side of the openings 53 for the side corresponding to the slit 57. Each opening area of each of the slits 57 is much smaller than each opening area of each of the openings 53. The width of each of the slits 57 is configured to be equal to or greater than 0.1 mm and less than or equal to 1.0 mm, for example. Each of these slits 57 serves to suppress deformation of the openings 53 in a case that thermal expansion occurs in the film forming mask 50.

The amount of elongation (amount of thermal expansion) ΔL due to thermal expansion of each portion of the mask sheet 51 is defined by the following formula.

$$\Delta L = \alpha^*(T2-T1)^*L$$

Here, "a" is a coefficient of linear expansion of the mask sheet 51. "T1" is the temperature before the mask sheet 51 changes due to thermal expansion. "T2" is the temperature at which the mask sheet 51 changes due to thermal expansion. "L" is the length in the direction to which the amount of thermal expansion in a case of "T1" is to be calculated.

In the portions of the outer frame portion 54 of the mask sheet 51 in which the slits 57 are formed, the value of "L" in the frame width direction decreases by the width of the slits 57, and thus the amount of thermal expansion in the frame width direction is reduced. In the portions of the first cross-piece portion 55 and the second cross-piece portion 56 of the mask sheet 51 in which the slits 57 are formed, the value of "L" in the cross-piece width direction decreases by the width of the slits 57, and thus the amount of thermal expansion in the cross-piece width direction is reduced.

Furthermore, in a case that thermal expansion occurs in the mask sheet 51, the thermal expansion also acts in the direction of narrowing the slits 57, and thus the amount of thermal expansion acting in the direction of narrowing the openings 53 is reduced, and the effect of thermal expansion on the openings 53 is reduced. During film formation using the film forming mask 50, the slits 57 narrow from the original are further narrowed due to thermal expansion of the mask sheet 51, and thus little or no film forming material is deposited on the mother substrate through the slits 57.

The mask sheet 51 is prepared by performing a hole punching process that forms the openings 53 and the slits 57 on a sheet shape from a metal material. Note that the mask sheet 51 may be prepared by a method in which a plurality of sheet shapes having band shapes are combined. The mask sheet 51 may be prepared by other methods in a manner in which the openings 53 and the slits 57 are formed.

The mask sheet 51 is fixed in a state in which tension is applied by bonding the outer frame portion 54 to the support frame 52 by spot welding using irradiation with laser light. Note that instead of spot welding, the mask sheet 51 may be bonded to the support frame 52 by an adhesive or a screw.

Method for Manufacturing Organic EL Display Device

Figure 7:
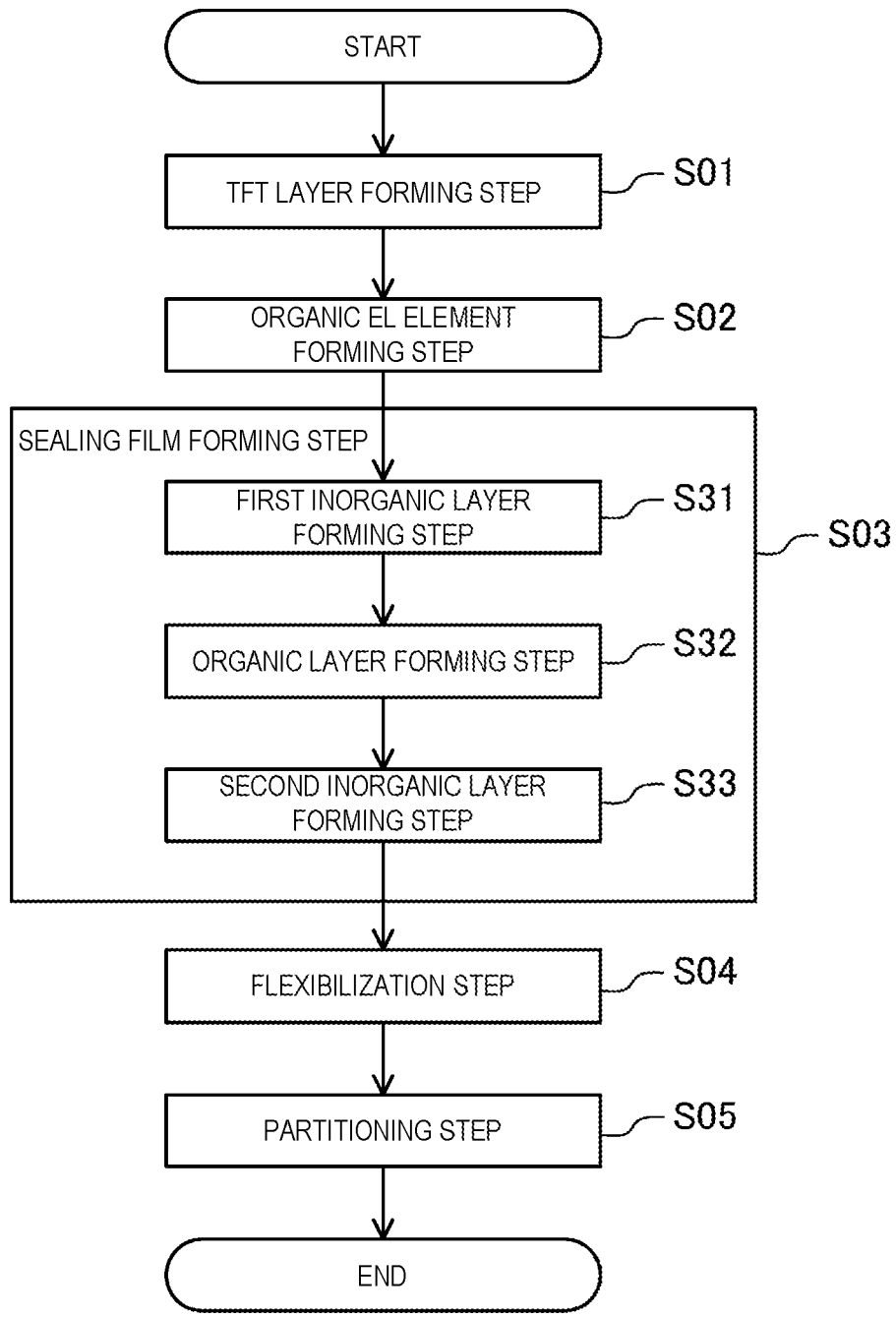
FIG. 7 is a flowchart of a method for manufacturing the organic EL display device according to the present embodiment.
Figure 8:
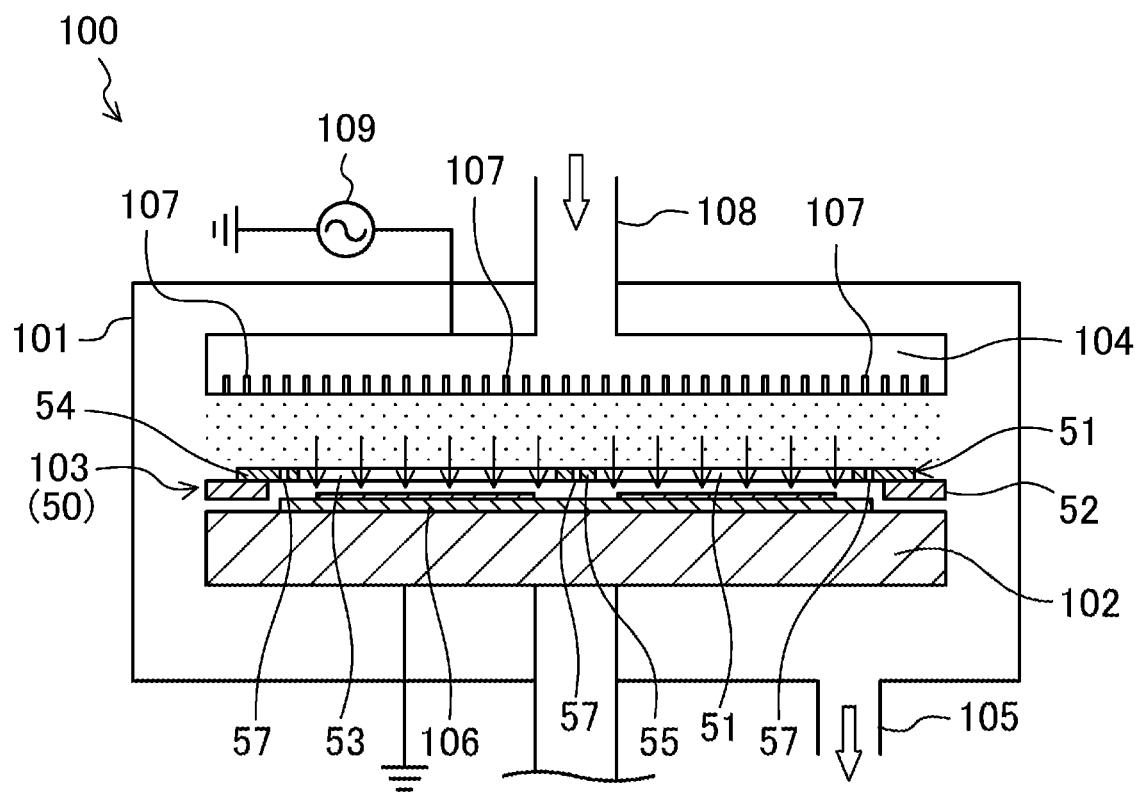
FIG. 8 is a step diagram illustrating the state of a sealing film forming step in the method for manufacturing the organic EL display device according to the present embodiment.

With reference to FIG. 7 and FIG. 8, a method for manufacturing of the organic EL display device 1 will be described below. FIG. 7 is a flowchart of a method for manufacturing the organic EL display device 1. FIG. 8 is a step diagram illustrating the state of a sealing film forming step S03 in the method for manufacturing the organic EL display device 1.

As illustrated in FIG. 7, the method for manufacturing the organic EL display device 1 includes a TFT layer forming step S01, an organic EL element forming step S02, a sealing film forming step S03, a flexibilization step S04, and a partitioning step S05.

First, in the TFT layer forming step S01, the TFT layer 8 is formed by forming the base coat film 11, the first TFTs 12, the second TFTs 13, the capacitors 14, and the flattening film 15 on the surface of the mother substrate having the size including the resin substrate layer 7 for four pieces formed on the glass substrate by a known method.

Next, in the organic EL element forming step S02, the organic EL element 9 is formed by forming the first electrodes 16, the organic EL layer 17 (the hole injection layer 21, the hole transport layer 22, the light-emitting layer 23, the electron transport layer 24, and the electron injection layer 25) and the second electrode 18 on the mother substrate on which the TFT layer 8 is formed by a known method.

Next, the sealing film forming step S03 includes a first inorganic layer forming step S31, an organic layer forming step S32, and a second inorganic layer forming step S33.

In the first inorganic layer forming step S31, the first inorganic layer 26 is formed by depositing a single layer film or a layered film of an inorganic insulating film formed from silicon nitride, silicon oxide, silicon oxynitride, or the like, for example, by a plasma CVD, by using a CVD mask, on the mother substrate on which the organic EL element 9 is formed. In the first inorganic layer forming step S31, the film forming mask 50 described above as a CVD mask is used, which will be described below.

Next, in the organic layer forming step S32, the organic layer 27 is formed by depositing an organic resin material such as acrylate on the mother substrate on which the first inorganic layer 26 is formed, for example, by an ink-jet method.

Next, in the second inorganic layer forming step S33, the second inorganic layer 28 is formed by depositing a single layer film or a layered film of an inorganic insulating film formed from silicon nitride, silicon oxide, silicon oxynitride, or the like, by a plasma CVD, by using a CVD mask 103, on the substrate on which the organic layer 27 is formed. In the second inorganic layer forming step S33, the film forming mask 50 described above as a CVD mask is used, which will be described below.

In this manner, in the sealing film forming step S03, the sealing film 10 is formed in which the first inorganic layer 26, the organic layer 27, and the second inorganic layer 28 are layered in order.

Next, in the flexibilization step S04, the glass substrate is peeled from the lower face of the mother substrate by irradiating the lower face of the mother substrate on which the sealing film 10 is formed from the glass substrate side with laser light.

Next, in the partitioning step S05, the mother substrate from which the glass substrate has been peeled is partitioned into four display panels by irradiating the boundary of the substrate region of the display panel unit constituting the individual organic EL display device 1 with laser light.

Next, the terminal exposure processing and the wiring line substrate mounting at the terminal portion 4 are performed on each of the partitioned display panels. The organic EL display device 1 can be manufactured as described above.

In the method for manufacturing the organic EL display device described above, in the first inorganic layer forming step S31, the first inorganic layer 26 is formed by using a plasma CVD apparatus 100 illustrated in FIG. 8. In the second inorganic layer forming step S33, the second inorganic layer 28 is formed by using a plasma CVD apparatus 100 similar to the first inorganic layer forming step S31. A method of forming the first inorganic layer 26 and the second inorganic layer 28 using the plasma CVD apparatus 100 will be described below.

Note that the first inorganic layer 26 and the second inorganic layer 28 are formed by different plasma CVD apparatuses 100, but the methods of forming the first inorganic layer 26 and the second inorganic layer 28 are the same, and thus, for convenience, in the description below, the first inorganic layer 26 and the second inorganic layer 28 are simply referred to as the "inorganic layer 26 or 28" in a case that the first inorganic layer 26 and the second inorganic layer 28 are not distinguished, and the methods of forming the first inorganic layer 26 and the second inorganic layer 28 will not be described separately.

The plasma CVD apparatus 100 used to form the inorganic layer 26 or 28 includes a film forming chamber 101, a substrate holder 102 provided inside the film forming chamber 101, a CVD mask 103, and a plate-like shower head 104.

The film forming chamber 101 has an exhaust port 105 connected to a vacuum pump not illustrated. A gate valve not illustrated is provided in the exhaust port 105. The film forming chamber 101 is configured so that the internal space can be maintained in a vacuum state during film formation by vacuuming the interior via the exhaust port 105.

The substrate holder 102 is configured to hold the mother substrate with the glass substrate on which the organic EL element 9 is formed (the organic layer 27 is formed in a case that the second inorganic layer 28 is formed) as the film formed substrate 106 by holding means such as electrostatic chucks in a posture in which the processed surface faces upward. The substrate holder 102 also serves as one electrode for plasma discharge and is grounded. A heater for heating the held film formed substrate 106 is incorporated into the substrate holder 102.

The CVD mask 103 is disposed above the film formed substrate 106 held by the substrate holder 102 so as to face the film formed surface. The film forming mask 50 described above is used as the CVD mask 103. The CVD mask 103 and the film formed substrate 106 have a positional relationship that is separated by a certain distance during film formation processing, or have a positional relationship that comes into contact with each other.

The shower head 104 has a plurality of discharge ports 107 facing downward, and is connected to a supply pipe 108 that supplies the film forming material so as to discharge the film forming material supplied from the supply pipe 108 downward from each of the discharge ports 107. This shower head 104 serves as the other electrode for plasma discharge and is connected to a high frequency power source 109.

In such a plasma CVD apparatus 100, the interior of the film forming chamber 101 is vacuumed while the film formed substrate 106 is held by the substrate holder 102, and the CVD mask 103 is brought into a positional relationship facing the film formed substrate 106. Furthermore, the film formed substrate 106 is heated to a predetermined temperature by using a heater of the substrate holder 102, and the material gas for forming the inorganic layer 26 or 28 is flowed from the shower head 104 to the substrate holder 102 side via the supply pipe 108.

Then, in the plasma CVD apparatus 100, the high frequency voltage is applied to the shower head 104 by the high frequency power source 109, and thus a plasma is generated between the shower head 104 and the substrate holder 102 in the film forming chamber 101. In a case that the plasma is generated in the film forming chamber 101, the material gas undergoes a chemical reaction with the energy of the plasma and deposits on the surface of the film formed substrate 106, and thus the inorganic layer 26 or 28 is formed.

During film formation of such inorganic layer 26 or 28, the atmospheric temperature is relatively high temperature (for example, approximately 80° C.), and heat is always applied to the CVD mask 103, so deformation due to thermal expansion occurs in the CVD mask 103. Even in a case that a material having a low coefficient of thermal expansion such as an Invar material is used in the CVD mask 103, deformation due to thermal expansion is not avoided in the CVD mask 103, However, in addition to the widths at the outer frame portion 54 and the first cross-piece portion 55 and the second cross-piece portion 56 in the mask sheet 51 being smaller due to forming the slits 57, the thermal expansion of the mask sheet 51 also acts in the direction of narrowing the slits 57. Therefore, the amount of thermal expansion acting in the direction of narrowing the openings 53 is reduced, and the effect of thermal expansion on the openings 53 is reduced. As a result, deformation of the openings 53 caused by thermal expansion during film formation of the CVD mask 103 is suppressed, so thus the patterning shape of the inorganic layer 26 or 28 that is formed by using the CVD mask 103 is stable.

In the plasma CVD apparatus 100, the plasma is generated by introducing a cleaning gas into the film forming chamber 101 each time a film formation processing is performed on a predetermined number (for example, three or six) of mother substrates, and so-called remote plasma cleaning is performed in which the film forming material attached to the inner walls of the film forming chamber 101, the substrate holder 102, and the CVD mask 103 is cleaned. Even in a case that the film forming material is accumulated in the slits 57 by the continuous use of the CVD mask 103, the film forming material accumulated in the slits 57 is removed by the remote plasma cleaning, so the slits 57 do not become plugged.

Figure 15:
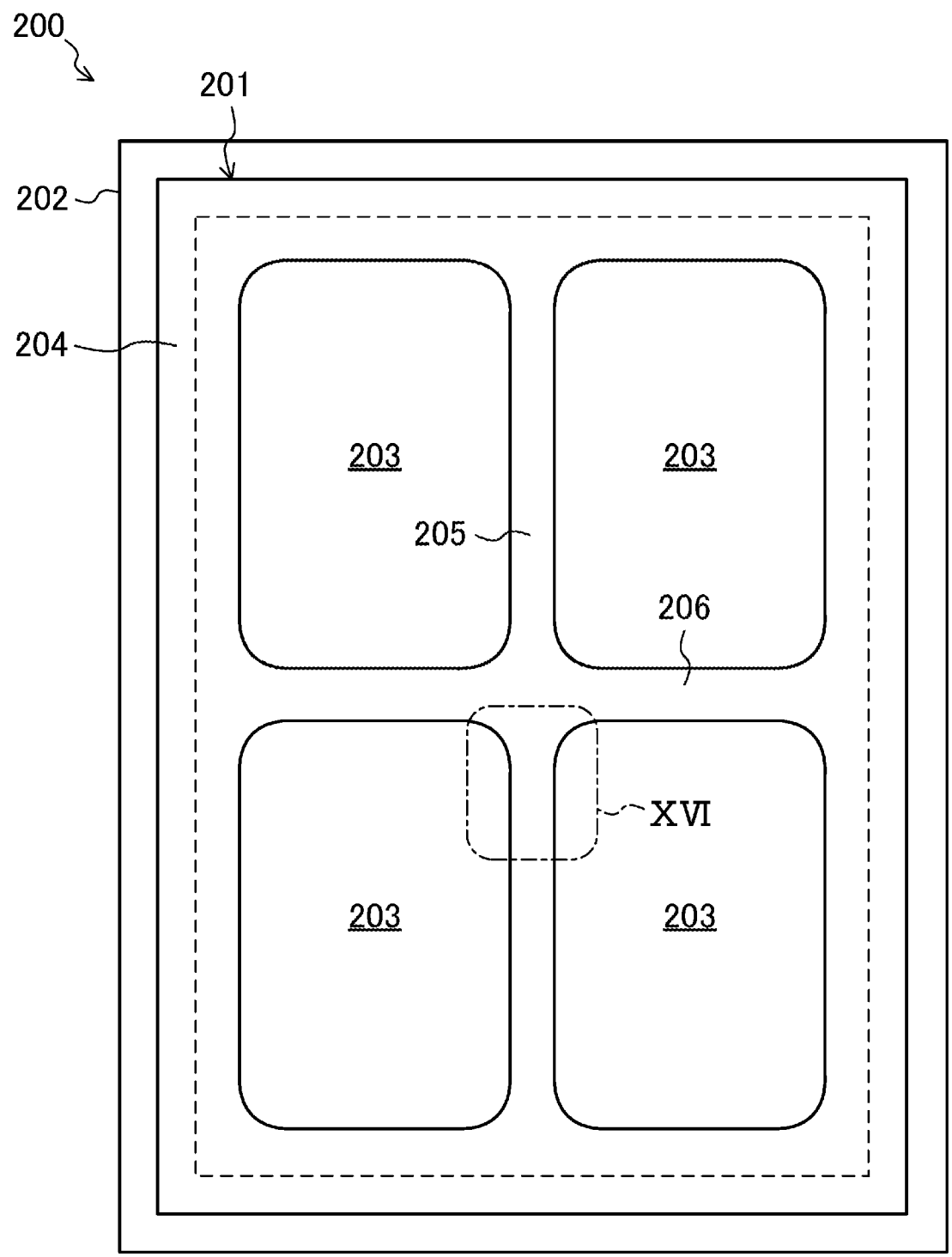
FIG. 15 is a plan view illustrating a schematic configuration of a film forming mask according to a comparative example.
Figure 16:
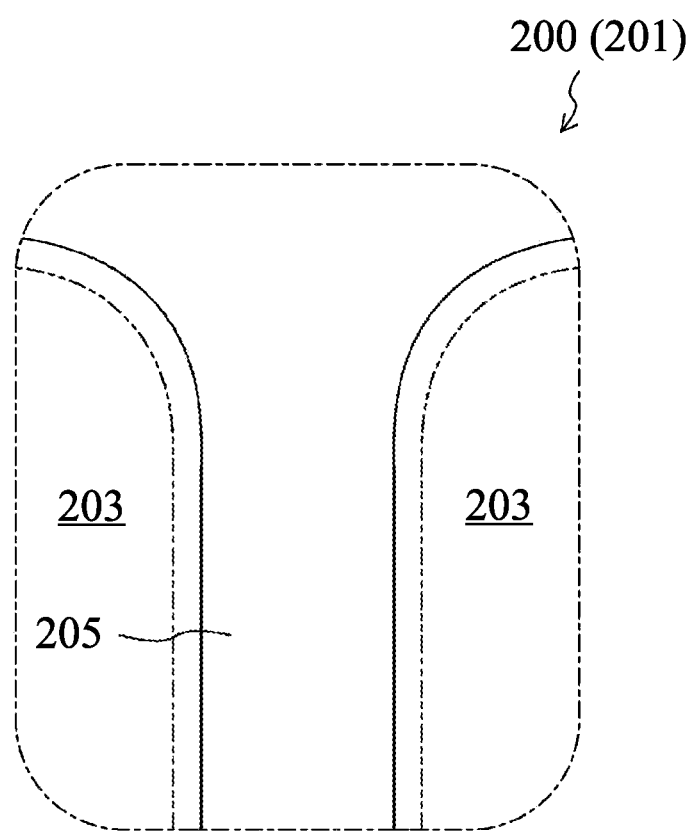
FIG. 16 is an enlarged view of a portion of the film forming mask surrounded by XVI illustrated in FIG. 15.

FIG. 15 is a plan view illustrating a schematic configuration of a film forming mask 200 according to a comparative example. FIG. 16 is an enlarged view of a portion of the film forming mask surrounded by XVI illustrated in FIG. 15. Note that, as in FIG. 6, the long dashed double-short dashed line in FIG. 16 indicates the periphery of openings 203 in a state where deformation due to thermal expansion has occurred in the film forming mask 200.

In the film forming mask 200 such as that illustrated in FIG. 15 in which openings such as slits are not formed in addition to the film forming openings 203, in a case that thermal expansion occurs due to exposing to a high temperature during film formation in a case that the film forming mask 200 is used to deposit the inorganic layer 26 or 28 by a plasma CVD, non-opening portions of the mask sheet 201, that is, the outer frame portion 204, the first cross-piece portion 205, and the second cross-piece portion 206 extend relatively greatly in a direction in which the openings 203 are narrowed while being fixed to the support frame 202. As a result, as illustrated by the long dashed double-short dashed line in FIG. 16, the film forming mask 200 is relatively greatly deformed in a direction in which the openings 203 are narrowed, so the patterning shape of the inorganic layer 26 or 28 changes depending on the amount of thermal expansion of the mask sheet 203 during film formation and tends to become unstable.

In contrast, with the film forming mask 50 according to the present embodiment, as illustrated in FIG. 6, deformation of the openings 53 in a case that thermal expansion occurs in the film forming mask 50 can be suppressed, and thus the patterning shape of the first inorganic layer 26 and the second inorganic layer 28 formed by using the film forming mask 50 can be stabilized. As a result, while the peripheral edges of the first inorganic layer 26 and the second inorganic layer 28 are positioned between the peripheral edge of the organic layer 27 and the peripheral edge of the resin substrate layer 7, the organic layer 27 can be completely covered by both of the inorganic layers 26 and 28, and thus deterioration of the organic EL element 9 can be suitably prevented by the sealing film, and the reliability of the organic EL display device 1 can be improved.

First Modified Example of Film Forming Mask

Figure 9:
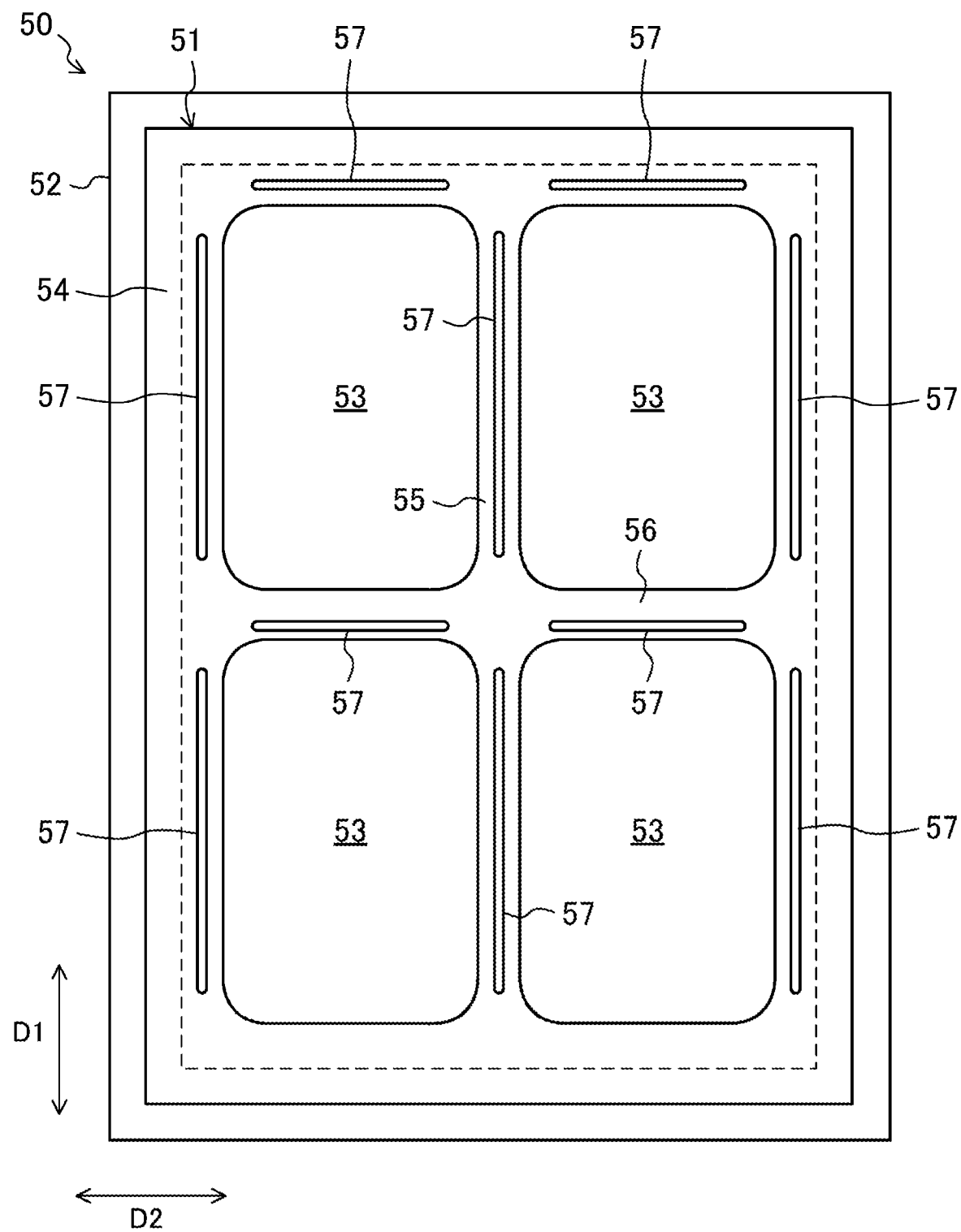
FIG. 9 is a plan view illustrating a schematic configuration of the film forming mask according to a first modified example.

FIG. 9 is a plan view illustrating a schematic configuration of the film forming mask 50 according to a first modified example.

In the film forming mask 50 according to the above embodiment, the slits 57 are formed so as to correspond to each side of the openings 53, but in the film forming mask 50 according to the first modified example, as illustrated in FIG. 9, no slit 57 is formed in each part corresponding to the terminal portion 4 of the organic EL display device 1 in the mask sheet 51.

Specifically, a portion of the mask sheet 51 along one side (the lower side in FIG. 9) of each of the openings 53 corresponds to the terminal portion 4 of the organic EL display device 1. In the mask sheet 51, the slits 57 formed in the second cross-piece portion 56 are formed so as to come to one side (the lower side in FIG. 9) in the cross-piece width direction of the second cross-piece portion 56, so as to deviate from a portion corresponding to the terminal portion 4 of the organic EL display device 1. No slit 57 is formed in a portion (the lower side portion in FIG. 9) that constitutes one side of the outer frame portion 54.

In a case that the slits 57 are formed in the portion of the mask sheet 51 corresponding to the terminal portion 4 of the organic EL display device 1, it is necessary to perform a step of removing the film forming material attached to the terminal portion 4 in a case that a non-negligible amount of film forming material is attached to the terminal portion 4. In contrast, according to the configuration described above, during film formation of the inorganic layer 26 or 28 using the film forming mask 50, because it is possible to avoid attaching the film forming material to the terminal portion 4 of the organic EL display device 1 through the slits 57 of the mask sheet 51, it is not necessary to perform a step of removing the film forming material of the terminal portion 4, and thus it is possible to improve the manufacturing efficiency of the organic EL display device 1.

Second Modified Example of Film Forming Mask

Figure 10:
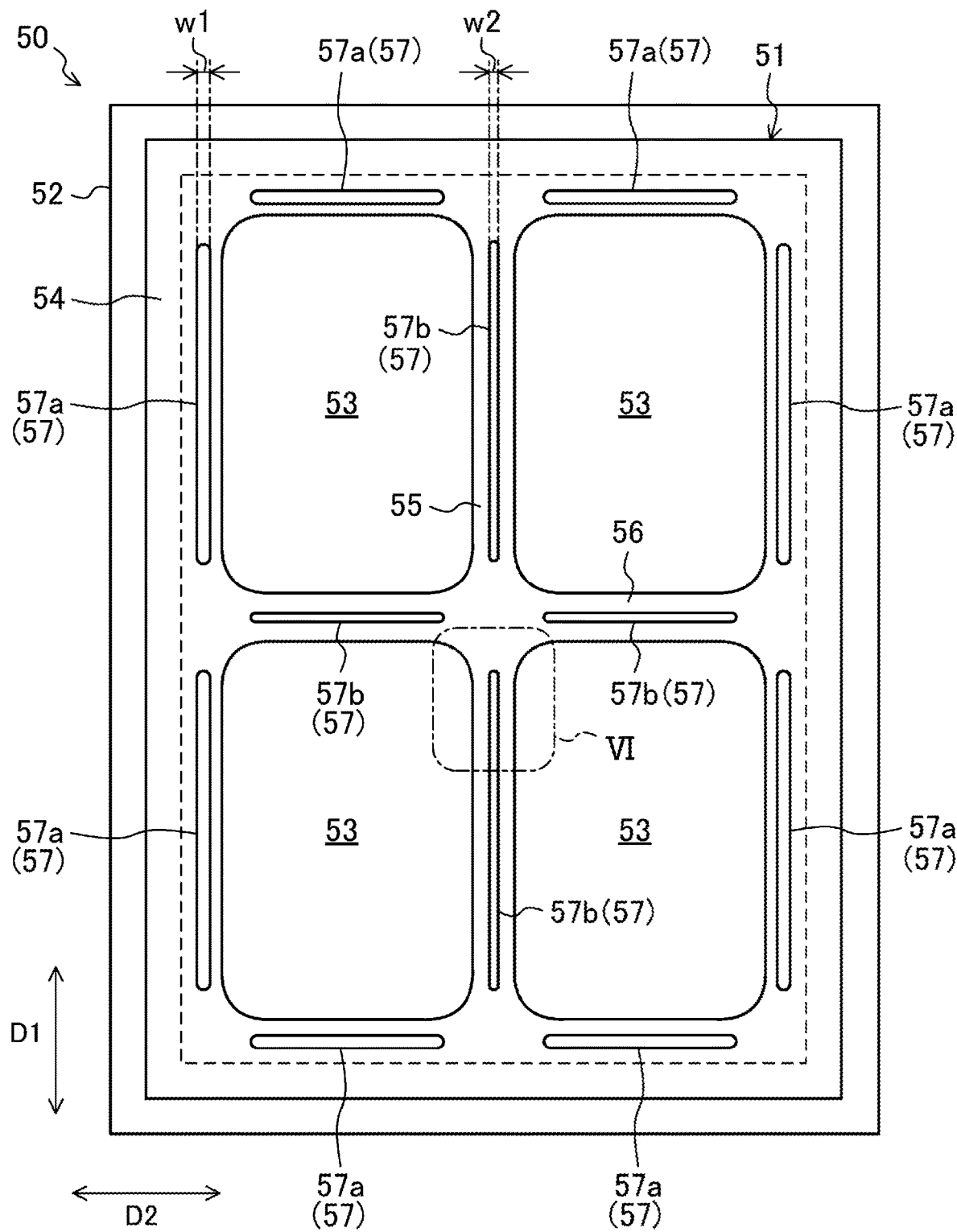
FIG. 10 is a plan view illustrating a schematic configuration of the film forming mask according to a second modified example.

FIG. 10 is a plan view illustrating a schematic configuration of the film forming mask 50 according to a second modified example.

In the film forming mask 50 according to the embodiment described above, the widths of each of the slits 57 are the same width, but in the film forming mask 50 according to the second modified example, as illustrated in FIG. 10, a width w1 of the slits 57a formed in the outer frame portion 54 of the mask sheet 51, that is, the dimension in the frame width direction of the slits 57a are configured to be larger than a width w2 of the slits 57b formed in the first cross-piece portion 55 and the second cross-piece portion 56, that is, the dimension in the cross-piece width direction of the slits 57b.

Because the outer frame portion 54 of the mask sheet 51 is fixed to the support frame 52, during film formation of the inorganic layer 26 or 28, there is a risk that the outer frame portion 54 of the mask sheet 51 is deformed inward due to thermal expansion of the support frame 52. In contrast, according to the configuration described above, the deformation of the outer frame portion 54 of the mask sheet 51 due to thermal expansion of the support frame 52 acts on the slits 57a formed in the relatively large width w1, so the effect on the openings 53 due to deformation of the outer frame portion 54 is further reduced. As a result, deformation of the openings 53 due to thermal expansion of the mask sheet 51 can be suitably suppressed.

Third Modified Example of Film Forming Mask

Figure 11:
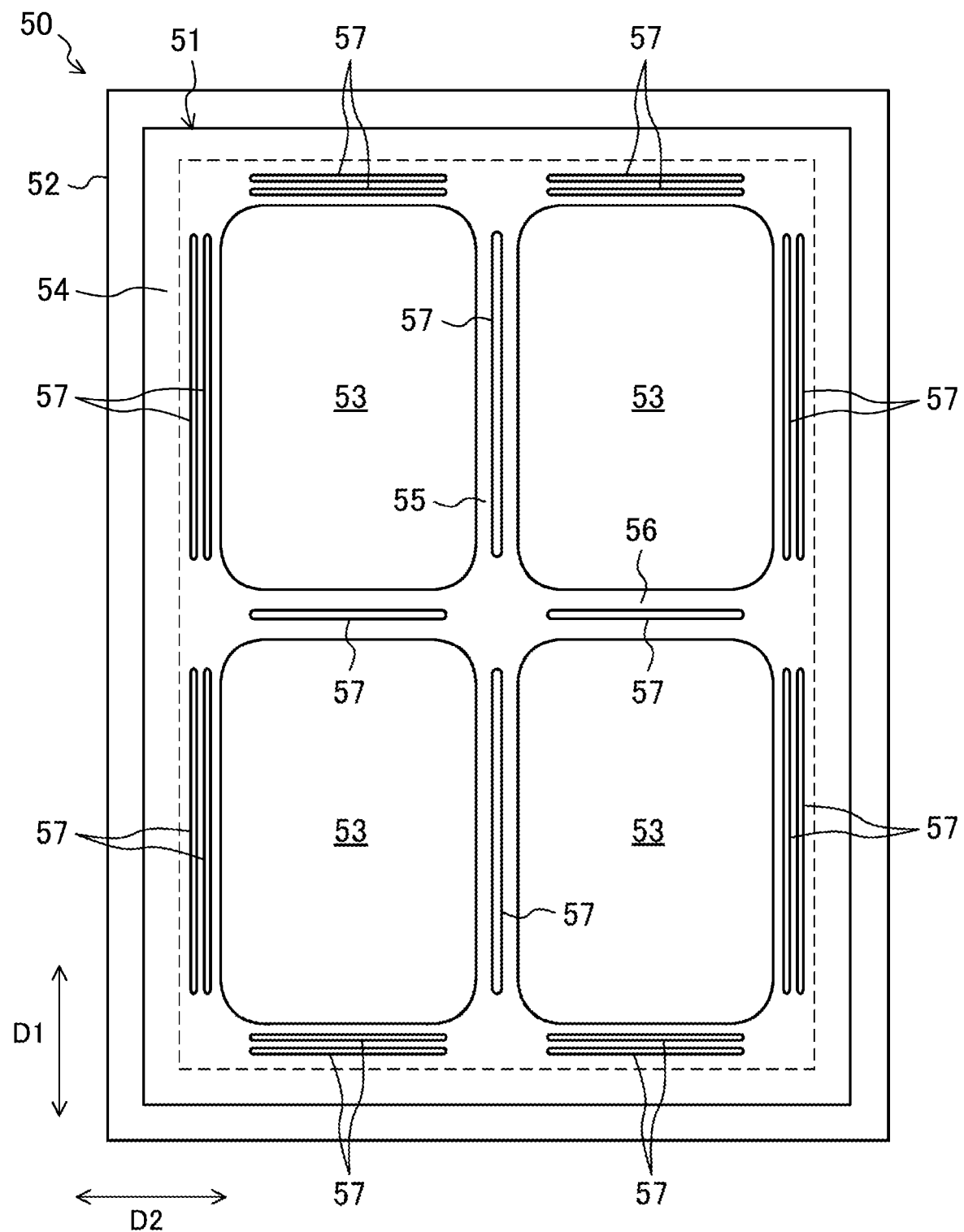
FIG. 11 is a plan view illustrating a schematic configuration of the film forming mask according to a third modified example.

FIG. 11 is a plan view illustrating a portion of the film forming mask 50 according to the third modified example.

In the film forming mask 50 according to the embodiment described above, the number of slits 57 formed per side of the openings 53 for the outer frame portion 54 and the number of slits 57 formed per side of the openings 53 for the first cross-piece portion 55 and the second cross-piece portion 56 are both one, but in the film forming mask 50 according to the third modified example, the slits 57 of the outer frame portion 54 are formed in a pair arranged side-by-side in the frame width direction orthogonal to the side of the openings 53 for the sides corresponding to the slits 57, as illustrated in FIG. 11.

The pairs of slits 57 are provided so as to extend parallel to each other along the periphery of the openings 53. Thus, in the film forming mask 50 of the third modified example, the number of slits 57 formed per side of the openings 53 for the outer frame portion 54 is one greater than the number of slits 57 formed per side of the openings 53 for the first cross-piece portion 55 and the second cross-piece portion 56.

According to such a configuration, deformation of the outer frame portion 54 of the mask sheet 51 due to thermal expansion of the support frame 52 acts on each of the slits 57 formed double in the frame width direction, so the effect on the openings 53 due to deformation of the outer frame portion 54 is further reduced. As a result, deformation of the openings 53 due to thermal expansion of the mask sheet 51 can be suitably suppressed.

Fourth Modified Example of Film Forming Mask

Figure 12:
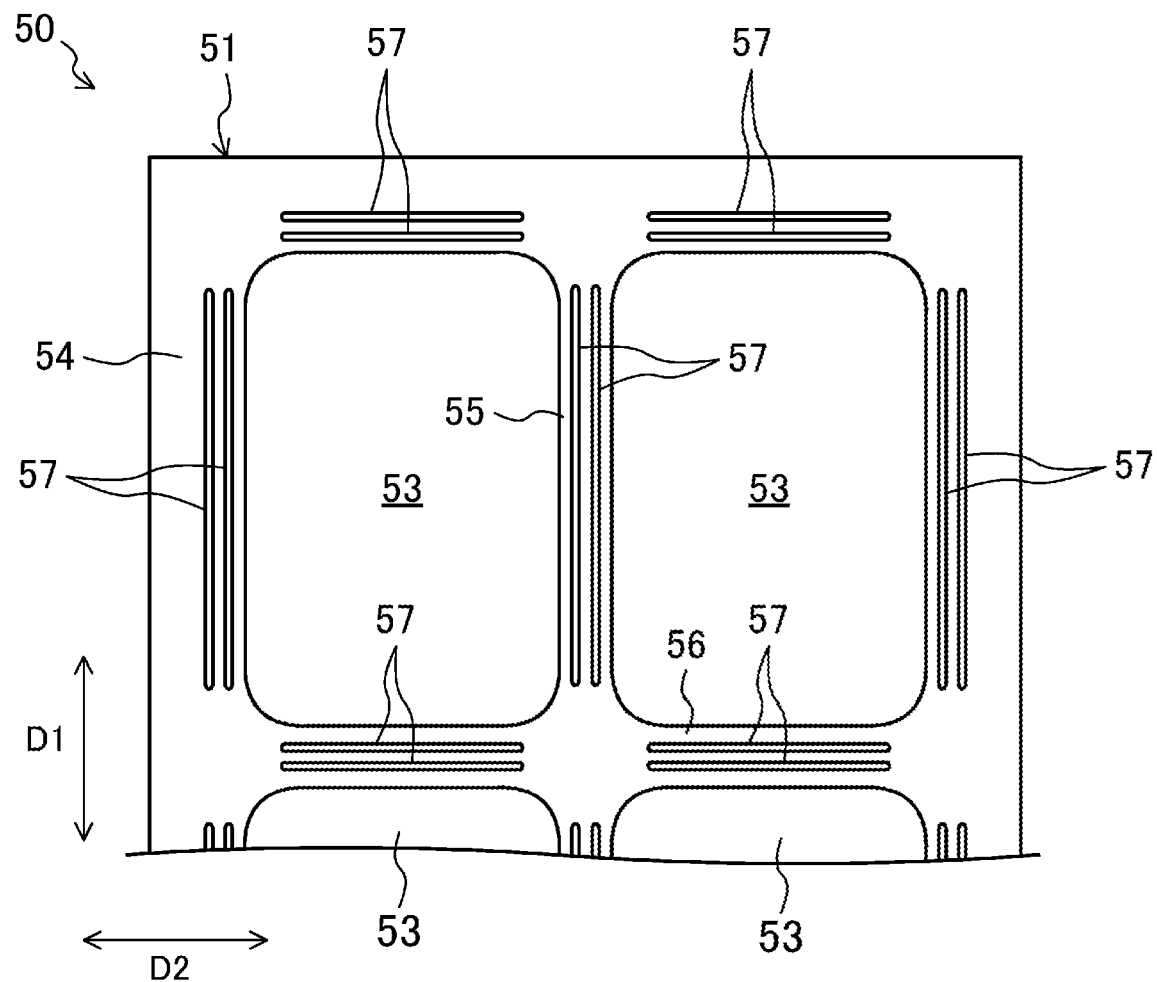
FIG. 12 is a plan view illustrating a portion of the film forming mask according to a fourth modified example.

FIG. 12 is a plan view illustrating a portion of the film forming mask 50 according to the fourth modified example.

In the film forming mask 50 according to the third modified example described above, the pairs of two slits 57 of the outer frame portion 54 are formed side-by-side in the frame width direction, but in the film forming mask 50 according to the fourth modified example, as illustrated in FIG. 12, the slits 57 of the first cross-piece portion 55 and the second cross-piece portion 56 are also formed in a pair arranged side-by-side in the cross-piece width direction.

According to such a configuration, deformation of the openings 53 is suppressed by the two slits 57 in a case that thermal expansion occurs in the film forming mask 50, and thus the widths of the individual slits 57 are narrowed. As a result, during film formation of the inorganic layer 26 or 28 using the film forming mask 50, it is possible to prevent the film forming material from adhering to the mother substrate through the slits 57 of the mask sheet 51 as much as possible.

Fifth Modified Example of Film Forming Mask

Figure 13:
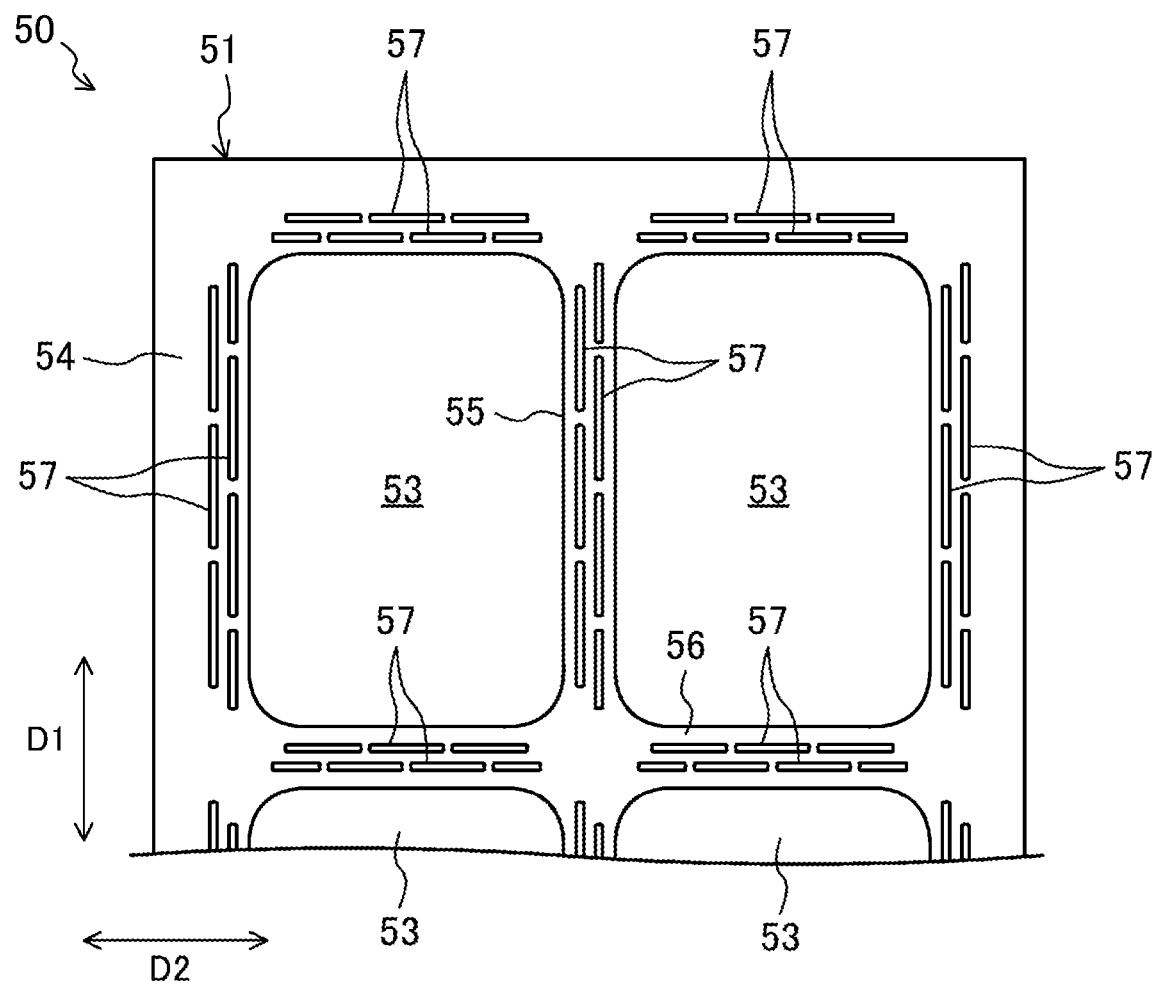
FIG. 13 is a plan view illustrating a portion of the film forming mask according to a fifth modified example.

FIG. 13 is a plan view illustrating a portion of the film forming mask 50 according to the fifth modified example.

In the film forming mask 50 according to the fourth modified example described above, each of the slits 57 is formed alone in each direction along each side of the openings 53 for the sides corresponding to the slits 57, but in the film forming mask 50 according to the fifth modified example, as illustrated in FIG. 13, a plurality of slits 57 are formed in rows at intervals in each direction along each side of the openings 53 for the sides corresponding to the slits 57.

Two rows of the slits 57 are formed in each direction orthogonal to each side of the openings 53 for the sides corresponding to the slits 57. In adjacent rows of the slits 57, the portions between the slits 57 in one row correspond to the slits 57 in the other row in each direction where each rows of the slits 57 are adjacent. In other words, the plurality of slits 57 formed in two rows formed for each side of each of the openings 53 are arranged in a zig-zag shape.

With such a configuration as well, similar to the fourth modified example described above, during film formation of the inorganic layer 26 or 28 using the film forming mask 50, while preventing the film forming material from adhering to the mother substrate through the slits 57 of the mask sheet 51 as much as possible, it is possible to stabilize the patterning shape of the first inorganic layer 26 and the second inorganic layer 28 formed by using the film forming mask 50.

Sixth Modified Example of Film Forming Mask

Figure 14:
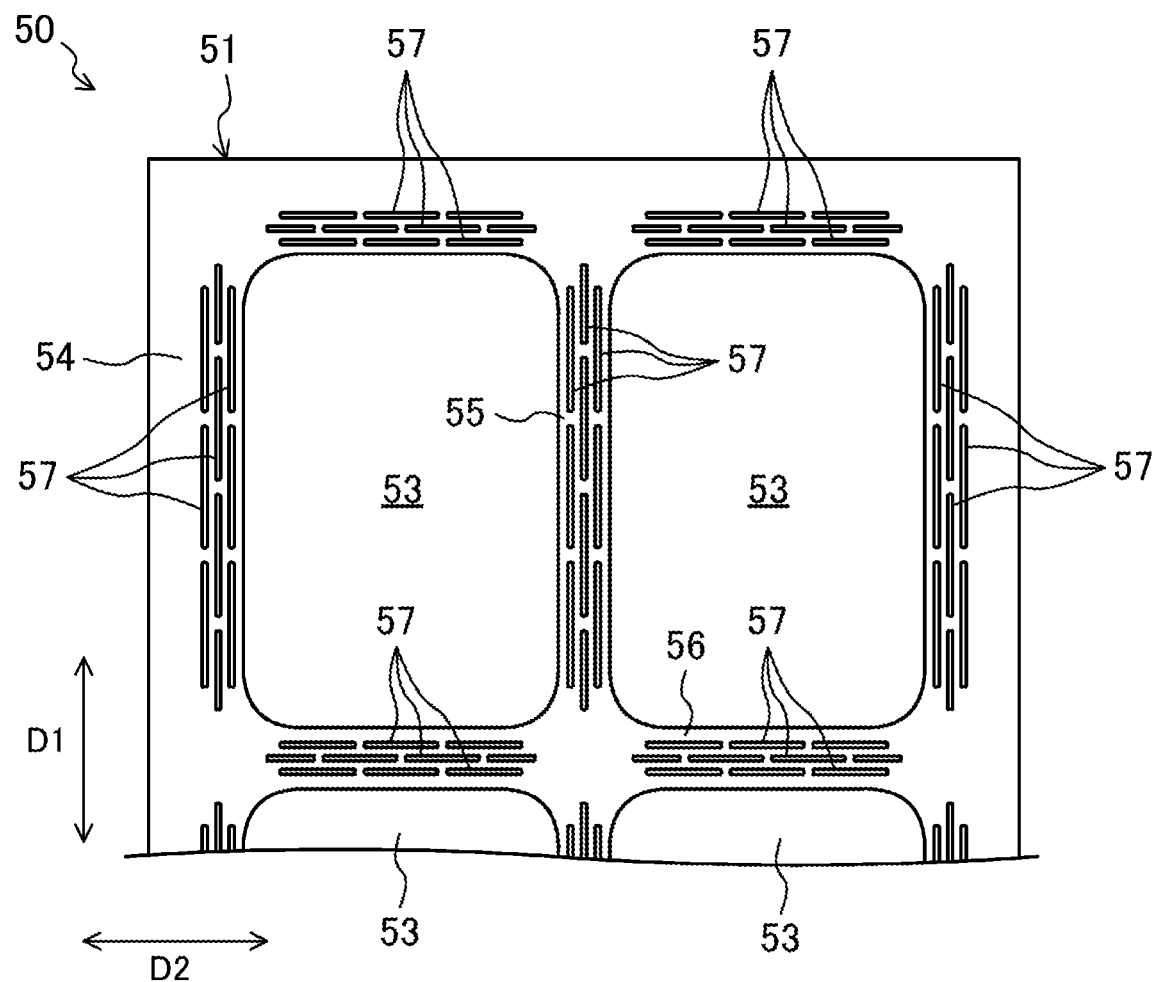
FIG. 14 is a plan view illustrating a portion of the film forming mask according to a sixth modified example.

FIG. 14 is a plan view illustrating a portion of the film forming mask 50 according to the sixth modified example.

In the film forming mask 50 according to the fifth modified example described above, two rows of the slits 57 are formed for each side of each of the openings 53, but in the film forming mask 50 according to the sixth modified example, three rows of the slits 57 are formed for each side of each of the openings 53, as illustrated in FIG. 14. The plurality of slits 57 formed in three rows are arranged in a zig-zag shape.

According to such a configuration, during film formation of the inorganic layer 26 or 28 using the film forming mask 50, while further preventing the film forming material from adhering to the mother substrate through the slits 57 of the mask sheet 51, it is possible to stabilize the patterning shape of the first inorganic layer 26 and the second inorganic layer 28 formed by using the film forming mask 50.

As described above, preferred embodiments and modified examples thereof have been described as examples of the technique disclosed herein. However, the presently disclosed technique is not limited thereto, and can be applied to embodiments in which changes, substitutions, additions, omissions, and the like have been performed as appropriate. The constituent elements described in the embodiments and modified examples described above can be combined into a new embodiment. The constituent elements described in the accompanying drawings and detailed description may also include constituent elements that are not essential for the purpose of solving the problems. As such, those constituent elements that are not essential should not be recognized as essential immediately as described in the accompanying drawings and detailed description.

For example, in the embodiments described above, an Invar material is given as an example for a material for forming the mask sheet 51 and the support frame 52, but the technical scope of the present disclosure is not limited to this example. The Invar material is only one example of a material for forming the mask sheet 51 and the support frame 52, and any metal material can be employed as the material for forming the mask sheet 51 and support frame 52, such as stainless steel, copper, alloys including other nickel (Ni) such as SUS and 42 alloy, as long as the coefficient of thermal expansion is low.

In the embodiments and the first to sixth modified examples described above, the slits 57 are formed in the outer frame portion 54 of the mask sheet 51 and both the first cross-piece portion 55 and the second cross-piece portion 56, but the technical scope of the present disclosure is not limited to this configuration. The slits 57 may be formed on the outer frame portion 54 and only one of the first cross-piece portion 55 and the second cross-piece portion 56, or may be formed only on the outer frame portion 54 or only on the first cross-piece portion 55 or the second cross-piece portion 56.

In the embodiments and the first to sixth modified examples described above, configurations in which the slits 57 are formed as the second openings for the mask sheet 51 have been described as an example, but the technique of the present disclosure is not limited to this configuration. The slits 57 are only one example of the second openings, and, as long as they serves to suppress deformation of the film forming openings 53 due to thermal expansion of the mask sheet 51, instead of the slits 57, a plurality of through-holes having a circle shape or the like may be formed in a predetermined arrangement around the openings 53, or openings of any shape can be employed as the second openings.

In the embodiments described above, the film forming mask 50 used in the method for manufacturing and taking four display panels constituting the organic EL display device 1 has been described as an example, but the technical scope of the present disclosure is not limited to this example. The film forming mask 50 according to the technique of the present disclosure may be used in a method for manufacturing a larger number of display panels in a multiple printing manner (for example, 48 multiple printing). In this case, the mask sheet 51 of the film forming mask 50 may have film forming openings (first openings) corresponding to the number of display panels to be manufactured, and other openings (second openings) such as slits may be formed in the periphery of the film forming openings.

In the embodiments described above, the organic EL display device 1 having four corners being rounded in a curved line shape has been used as an example, but the scope of application of the present disclosure is not limited to this example. In the organic EL display device 1, all or some of the four corners may not have a curved line shape, or the organic EL display device 1 may be formed in a rectangular shape having four corners being square-built. The outer shape of the organic EL display device 1 is not limited to a substantially rectangular shape or a rectangular shape, and may be other polygonal shapes having a plurality of corner portions and a plurality of sides connecting corner portions adjacent to each other, or substantially polygonal shapes in which corner portions have a curved line shape.

The film forming mask 50 according to the technique of the present disclosure can be used to manufacture such an organic EL display device 1 in accordance with the shape of the openings 53 corresponding to the outer shape of the organic EL display device 1. In this case, a plurality of the slits 57 are preferably formed so as to correspond to two or more sides of the plurality of sides of the openings 53 from the perspective of suppressing deformation of the openings 53 due to thermal expansion of the mask sheet 51.

In the embodiments described above, the organic EL display device 1 using the resin substrate layer 7 as the base substrate is exemplified, but the scope of application of the technique of the present disclosure is not limited thereto. A substrate made of an inorganic material such as glass or quartz, a plastic such as polyethylene terephthalate, or a ceramic such as alumina may be used as the base substrate. The base substrate may be a substrate coated with silica gel, an organic insulating material, or the like, on one surface of a metal substrate such as aluminum or iron, or a substrate that has been subjected to an insulation treatment by a method such as anode oxidation on the surface of the metal substrate. The film forming mask 50 according to the technique of the present disclosure can also be used in manufacturing such an organic EL display device 1.

In the embodiments described above, the top gate type structure is employed for the first TFTs 12 and the second TFTs 13, but the scope of application of the technique of the present disclosure is not limited thereto. The first TFTs 12 and the second TFTs 13 may employ a bottom gate type structure, and the film forming mask 50 according to the technique of the present disclosure can be used in manufacturing such an organic EL display device 1.

In the embodiments described above, the organic EL layers 17 having a five-layer layered structure including the hole injection layer 21, the hole transport layer 22, the light-emitting layer 23, the electron transport layer 24, and the electron injection layer 25 have been exemplified, but the scope of application of the technique of the present disclosure is not limited thereto. The organic EL layers 17 may, for example, employ a three layer layered structure including a hole injection layer and electron transport layer, a light-emitting layer, and an electron transport layer and electron injection layer, and the film forming mask 50 according to the technique of the present disclosure can be used in manufacturing of such an organic EL display device 1.

In the embodiments described above, the organic EL display device 1 having the first electrode 16 as the anode electrode and the second electrode 18 as the cathode electrode has been exemplified, but the scope of application of the technique of the present disclosure is not limited to thereto. The film forming mask 50 according to the technique of the present disclosure can be used, for example, in manufacturing an organic EL display device in which the layered structure of the organic EL layers 17 is inverted, where the first electrodes 16 is the cathode electrode, and the second electrode 18 is the anode electrode.

In the embodiments described above, the film forming mask 50 used to form the first inorganic layer 26 and the second inorganic layer 28 that constitute the sealing film 10 has been described as an example, but the scope of application of the technique of the present disclosure is not limited thereto. The film forming mask 50 according to the technique of the present disclosure can also be applied to a film forming mask used to form the second electrode 18 of the organic EL element 9.

In the embodiments described above, the organic EL display device is described as an example of a display device, but the scope of application of the technique of the present disclosure is not limited thereto. The film forming mask 50 according to the technique of the present disclosure can be applied to manufacturing a display device including a plurality of light-emitting elements driven by a current. For example, the film forming mask 50 according to the technique of the present disclosure can be applied to manufacturing a display device including a Quantum-dot Light Emitting Diode (QLED), which is a light-emitting element using a quantum dot-containing layer.

INDUSTRIAL APPLICABILITY

As described above, the technique of the present disclosure is useful for a method for manufacturing a film forming mask and a display device using the same.

REFERENCE SIGNS LIST

D1 First direction
D2 Second direction
w1, w2 Width of slit
1 Organic EL display device
2 Display region
3 Frame region
4 Terminal portion
5 Pixel
6, 6r, 6g, 6b Subpixel
7 Resin substrate layer
8 TFT layer
9 Organic EL element
10 Sealing film
11 Base coat film
12 First TFT
13 Second TFT
14 Capacitor
15 Flattening film
16 First electrode
17 Organic EL layer
18 Second electrode
19 Contact hole
20 Edge cover
21 Hole injection layer
22 Hole transport layer
23 Light-emitting layer
24 Electron transport layer
25 Electron injection layer
26 First inorganic layer
27 Organic layer
28 Second inorganic layer
50 Film forming mask
51 Mask sheet
52 Support frame
53 Opening (first opening)
54 Outer frame portion
55 First cross-piece portion
56 Second cross-piece portion
57, 57a, 57b Slit (second opening)
100 Plasma CVD apparatus
101 Film forming chamber
102 Substrate holder
103 CVD mask (film forming mask)
104 Shower head
106 Film formed substrate
107 Discharge port
108 Supply pipe
109 High frequency power source
200 Film forming mask
201 Mask sheet
202 Support frame
203 Opening
204 Outer frame portion
205 First cross-piece portion
206 Second cross-piece portion

The invention claimed is:

1. A film forming mask comprising:
a plurality of first openings formed on the film forming mask for film-forming a thin film pattern on a substrate;
an outer frame portion;
a first cross-piece portion extending in a first direction inside the outer frame portion;
a second cross-piece portion extending in a second direction intersecting with the first direction inside the outer frame portion; and
a plurality of second openings, each of the plurality of second openings corresponding to, and aligned along, a side of at least one of the plurality of first openings, each side in each of the plurality of first openings corresponding to at least one of the plurality of second openings,
wherein an opening area of each of the plurality of second openings is smaller than an opening area of each of the plurality of first openings,
the plurality of first openings is defined and formed by the outer frame portion, the first cross-piece portion, and the second cross-piece portion,
the plurality of second openings is formed in the outer frame portion, the first cross-piece portion, and the second cross-piece portion, and
a dimension in a frame width direction of each of the plurality of second openings formed in the outer frame portion is greater than a dimension in a cross-piece width direction of each of the plurality of second openings formed in the first and second cross-piece portions.

2. The film forming mask according to claim 1, wherein the plurality of first openings are openings for forming a common thin film pattern in a plurality of pixels in a display device.

3. The film forming mask according to claim 1, wherein one of the plurality of second openings is formed at a center portion of at least one cross-piece portion of the first cross-piece portion and the second cross-piece portion.

4. A method for manufacturing a display device including an inorganic layer, the method comprising:
forming, by using a Chemical Vapor Deposition (CVD) mask, the inorganic layer on a substrate by a CVD, wherein the CVD mask used in forming the inorganic layer is the film forming mask described in claim 1.

5. A film forming mask comprising:
a plurality of first openings formed on the film forming mask for film-forming a thin film pattern on a substrate;
an outer frame portion;
a first cross-piece portion extending in a first direction inside the outer frame portion;
a second cross-piece portion extending in a second direction intersecting with the first direction inside the outer frame portion; and a plurality of second openings, each of the plurality of second openings corresponding to, and aligned along, a side of at least one of the plurality of first openings, each side in each of the plurality of first openings corresponding to at least one of the plurality of second openings, wherein an opening area of each of the plurality of second openings is smaller than an opening area of each of the plurality of first openings, the plurality of second openings is formed in the outer frame portion, the first cross-piece portion, and the second cross-piece portion, and a number of the plurality of second openings aligned in a frame width direction formed per one side of each of the plurality of first openings for the outer frame portion is greater than a number of the plurality of second openings aligned in a cross-piece width direction formed per one side of each of the plurality of first openings for first and second cross-piece portions.

6. The film forming mask according to claim 5, wherein the plurality of first openings are openings for forming a common thin film pattern in a plurality of pixels in a display device.

7. A method for manufacturing a display device including an inorganic layer, the method comprising:

forming, by using a Chemical Vapor Deposition (CVD) mask, the inorganic layer on a substrate by a CVD, wherein the CVD mask used in forming the inorganic layer is the film forming mask described in claim 5.

\* \* \* \* \*